(12) United States Patent
Lee et al.

(10) Patent No.: US 11,276,746 B2
(45) Date of Patent: Mar. 15, 2022

(54) DISPLAY DEVICE INCLUDING CONNECTION WIRING PART OVERLAPPING DRIVING VOLTAGE WIRING AND CONTACTING SENSING SIGNAL WIRING

(71) Applicant: SAMSUNG DISPLAY CO., LTD., Yongin-si (KR)

(72) Inventors: Sunhwa Lee, Yongin-si (KR); Kihyun Pyo, Seoul (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/903,867

(22) Filed: Jun. 17, 2020

(65) Prior Publication Data
US 2021/0005699 A1 Jan. 7, 2021

(30) Foreign Application Priority Data
Jul. 1, 2019 (KR) ........................ 10-2019-0078941

(51) Int. Cl.
*H01L 27/32* (2006.01)
*G09G 3/3258* (2016.01)
*H01L 51/52* (2006.01)

(52) U.S. Cl.
CPC ....... *H01L 27/3276* (2013.01); *G09G 3/3258* (2013.01); *H01L 27/323* (2013.01); *H01L 27/3262* (2013.01); *H01L 51/5246* (2013.01); *H01L 2251/301* (2013.01)

(58) Field of Classification Search
CPC ............... H01L 27/3276; H01L 27/323; H01L 27/3262; H01L 51/5246; G09G 3/3258
USPC .......................................................... 257/40
See application file for complete search history.

(56) References Cited

U.S. PATENT DOCUMENTS

| | | | |
|---|---|---|---|
| 2018/0033831 A1* | 2/2018 | An | G06F 3/044 |
| 2018/0059869 A1* | 3/2018 | Ma | G06F 3/0445 |
| 2018/0101270 A1* | 4/2018 | Cho | G02F 1/1343 |

FOREIGN PATENT DOCUMENTS

KR 10-2018-0014384 A 2/2018

* cited by examiner

*Primary Examiner* — Matthew E. Gordon
(74) *Attorney, Agent, or Firm* — Lewis Roca Rothgerber Christie LLP

(57) ABSTRACT

A display device includes a base layer including an active area and a peripheral area outside the active area, a circuit element layer including a pixel circuit in the active area and a driving voltage wiring located in the peripheral area to supply a driving voltage to the pixel circuit. A light emitting element layer including a plurality of light emitting elements on the circuit element layer, a thin film sealing layer to cover the light emitting element layer, and an input sensing layer on the thin film sealing layer and including a sensing electrode and a sensing signal wiring part connected to the sensing electrode. The circuit element layer includes a connection wiring part overlapping the driving voltage wiring in the peripheral area and contacts the sensing signal wiring part. The connection wiring part is at a different layer from the driving voltage wiring.

13 Claims, 14 Drawing Sheets

DISPLAY DEVICE INCLUDING CONNECTION WIRING PART OVERLAPPING DRIVING VOLTAGE WIRING AND CONTACTING SENSING SIGNAL WIRING

CROSS-REFERENCE TO RELATED APPLICATIONS

This application claims priority to and the benefit of Korean Patent Application No. 10-2019-0078941, filed on Jul. 1, 2019, the entire content of which is hereby incorporated by reference.

BACKGROUND

The present disclosure herein relates to a display device, and more particularly, to a display device with relatively high sensitivity (e.g., improved sensing sensitivity).

An electronic device is activated in response to an electrical signal. An electronic device may include multiple devices composed of various electronic components, such as a display unit for displaying an image, or an input detection unit for detecting an external input. Electronic components may be electrically interconnected by variously arranged signal lines.

There may be various different numbers of signal lines depending on the number of electronic components or the processing environment. The signal lines may be designed to be arranged with a proper spacing therebetween to prevent or reduce electrical signal interference within a set or predetermined panel area. The signal lines may receive electrical signals applied from the outside through pads (e.g., electrical pads). As the processing speed or the amount of processing data of the electronic device increases, a larger number of signal lines and the pads may be desired. Accordingly, mutual interference between electronic components or signal lines may increase.

SUMMARY

The present disclosure is to provide a display device with relatively high sensitivity (e.g., improved sensing sensitivity) of an electronic module.

An embodiment of the present disclosure provides a display device including: a base layer including an active area and a peripheral area located outside the active area; a circuit element layer including a pixel circuit located in the active area of the base layer and a driving voltage wiring located in the peripheral area of the base layer to supply a driving voltage to the pixel circuit; a light emitting element layer including a plurality of light emitting elements on the circuit element layer; a thin film sealing layer configured to cover the light emitting element layer; and an input sensing layer located on the thin film sealing layer and including a sensing electrode and a sensing signal wiring part connected to the sensing electrode.

The circuit element layer includes a connection wiring part overlapping the driving voltage wiring in the peripheral area on a plane and configured to contact the sensing signal wiring part.

The connection wiring part is located on a different layer from the driving voltage wiring.

In some embodiments, the sensing electrode includes a first sensing electrode; and a second sensing electrode electrically insulated from the first sensing electrode to form a capacitance. In some embodiments, the sensing signal wiring part includes a reception wiring part connected to the first sensing electrode; and a transmission wiring part connected to the second sensing electrode. In some embodiments, the connection wiring part contacts the reception wiring part or the transmission wiring part.

In some embodiments, the transmission wiring part includes a first transmission wiring part connected to one end of the second sensing electrode; and a second transmission wiring part connected to the other end of the second sensing electrode. In some embodiments, the connection wiring part contacts the second transmission wiring part.

In some embodiments, the second transmission wiring part includes a plurality of other side transmission wirings connected to the other end of the second sensing electrode; a first sensing contact part located at one end of the plurality of other side transmission wirings; and a second sensing contact part located at the other end of the plurality of other side transmission wirings. In some embodiments, the connection wiring part includes a plurality of sensing connection wirings extending along the plurality of other side transmission wirings; a first contact part connected to one end of the plurality of sensing connection wirings to face the first sensing contact part; and a second contact part connected to the other end of the plurality of sensing connection wirings to face the second sensing contact part.

In some embodiments, the plurality of sensing connection wirings is overlapping the driving voltage wiring. In some embodiments, the first sensing contact part directly contacts the first contact part, and the second sensing contact part directly contacts the second contact part. In some embodiments, each of the plurality of other side transmission wirings includes a first wiring layer on the thin film sealing layer; and a second wiring layer located adjacent to the first wiring layer with a touch insulating layer interposed therebetween. In some embodiments, the first wiring layer and the second wiring layer are electrically connected to each other. In some embodiments, each of the plurality of other side transmission wirings includes one of the first wiring layer and the second wiring layer in a crossing area where the plurality of sensing connection wirings cross.

In some embodiments, the pixel circuit includes a pixel transistor includes a control electrode, an output electrode, and an input electrode; and a connection electrode on the output electrode. In some embodiments, wherein the light emitting element is electrically connected to the connection electrode. In some embodiments, the driving voltage wiring is located at the same layer as the connection electrode. In some embodiments, the connection wiring part is located at the same layer as the input electrode and the output electrode. In some embodiments, the active area includes a non-display area having at least one hole, and having a display area surrounding the non-display area. In some embodiments, the pixel circuit and the light emitting element are located in the display area.

In an embodiment of the present disclosure, a display device includes: a base layer including an active area and a peripheral area located outside the active area; a circuit element layer including a pixel circuit located in the active area of the base layer and a driving voltage wiring located in the peripheral area of the base layer to supply a driving voltage to the pixel circuit; a light emitting element layer including a plurality of light emitting elements on the circuit element layer; a thin film sealing layer configured to cover the light emitting element layer; and an input sensing layer located on the thin film sealing layer and including a sensing electrode and a sensing signal wiring part connected to the sensing electrode.

The circuit element layer includes a connection wiring part located on the same layer as the driving voltage wiring in the peripheral area on a plane and contacting the sensing signal wiring part.

In some embodiments, the sensing electrode includes a first sensing electrode; and a second sensing electrode electrically insulated from the first sensing electrode to form a capacitance. In some embodiments, the sensing signal wiring part includes a reception wiring part connected to the first sensing electrode; and a transmission wiring part connected to the second sensing electrode, wherein the connection wiring part contacts the reception wiring part or the transmission wiring part.

In some embodiments, the transmission wiring part includes a first transmission wiring part connected to one end of the second sensing electrode; and a second transmission wiring part connected to the other end of the second sensing electrode. In some embodiments, the connection wiring part contacts the second transmission wiring part. In some embodiments, the second transmission wiring part includes a plurality of other side transmission wirings connected to the other end of the second sensing electrode; a first sensing contact part located at one end of the plurality of other side transmission wirings; and a second sensing contact part located at the other end of the plurality of other side transmission wirings.

In some embodiments, the connection wiring part includes a plurality of sensing connection wirings extending along the plurality of other side transmission wirings; a first contact part connected to one end of the plurality of sensing connection wirings to face the first sensing contact part; and a second contact part connected to the other end of the plurality of sensing connection wirings to face the second sensing contact part. In some embodiments, the pixel circuit includes a pixel transistor including a control electrode, an output electrode, and an input electrode. In some embodiments, the light emitting element is electrically connected to the output electrode. In some embodiments, the driving voltage wiring and the plurality of other side transmission wirings are located at the same layer as the input and output electrodes.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
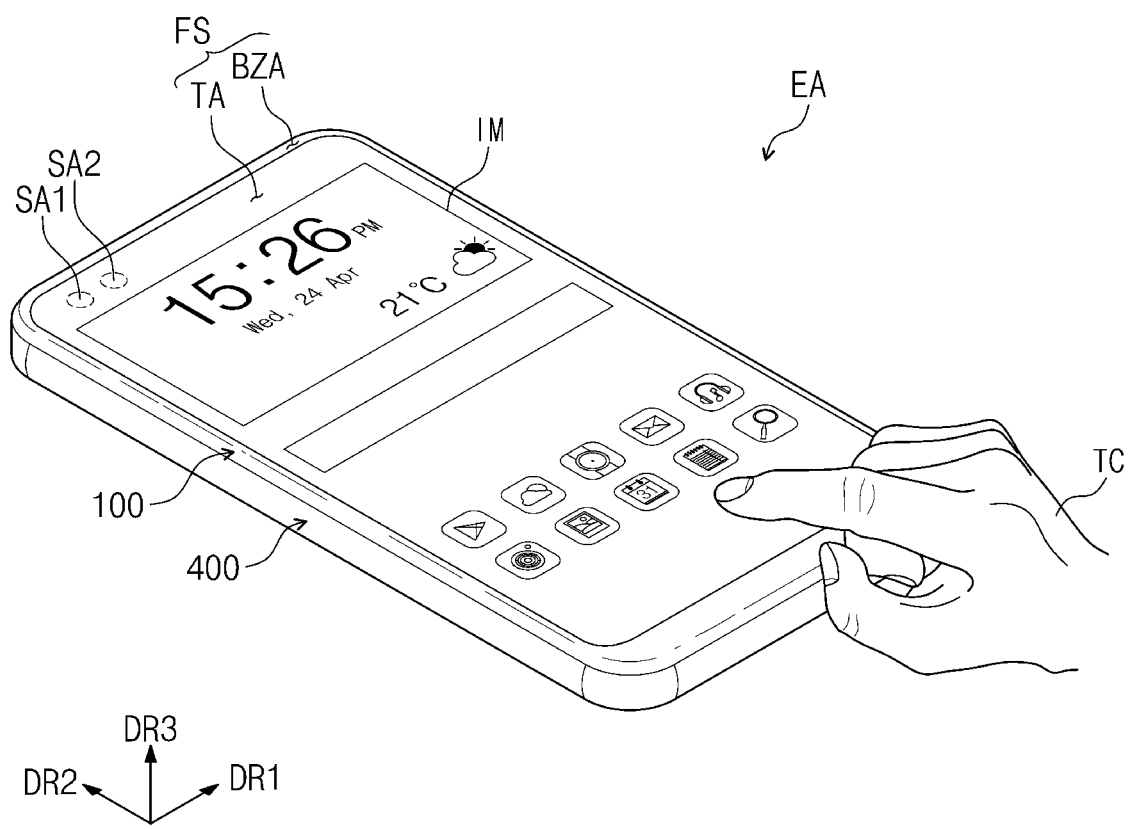
FIG. 1A is a perspective view of a display device according to an embodiment of the present disclosure.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Hereinafter, another embodiment of the present disclosure will be described with reference to the drawings.

Figure 1B:
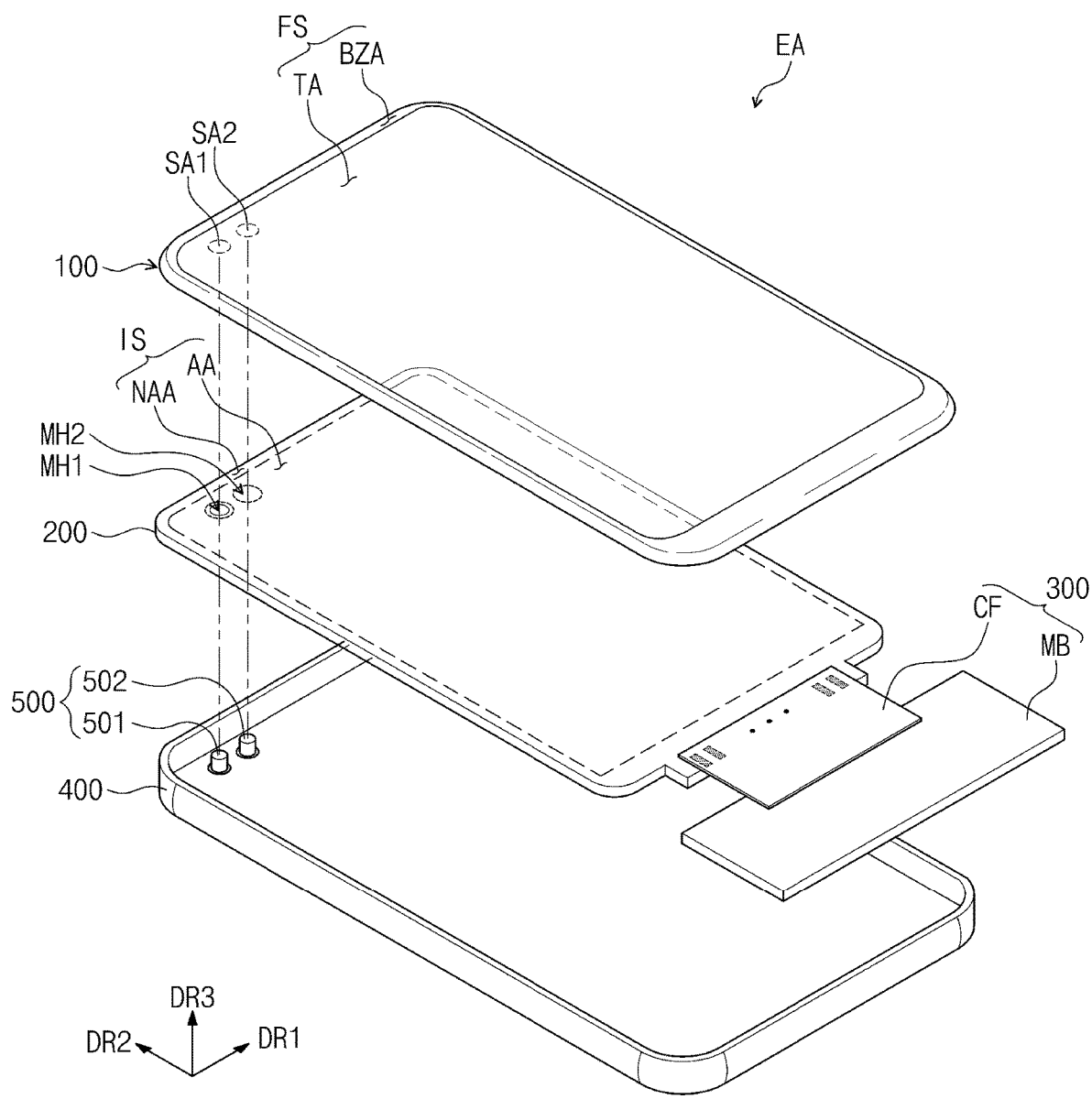
FIG. 1B is an exploded perspective view of a display device according to an embodiment of the present disclosure.
Figure 2:
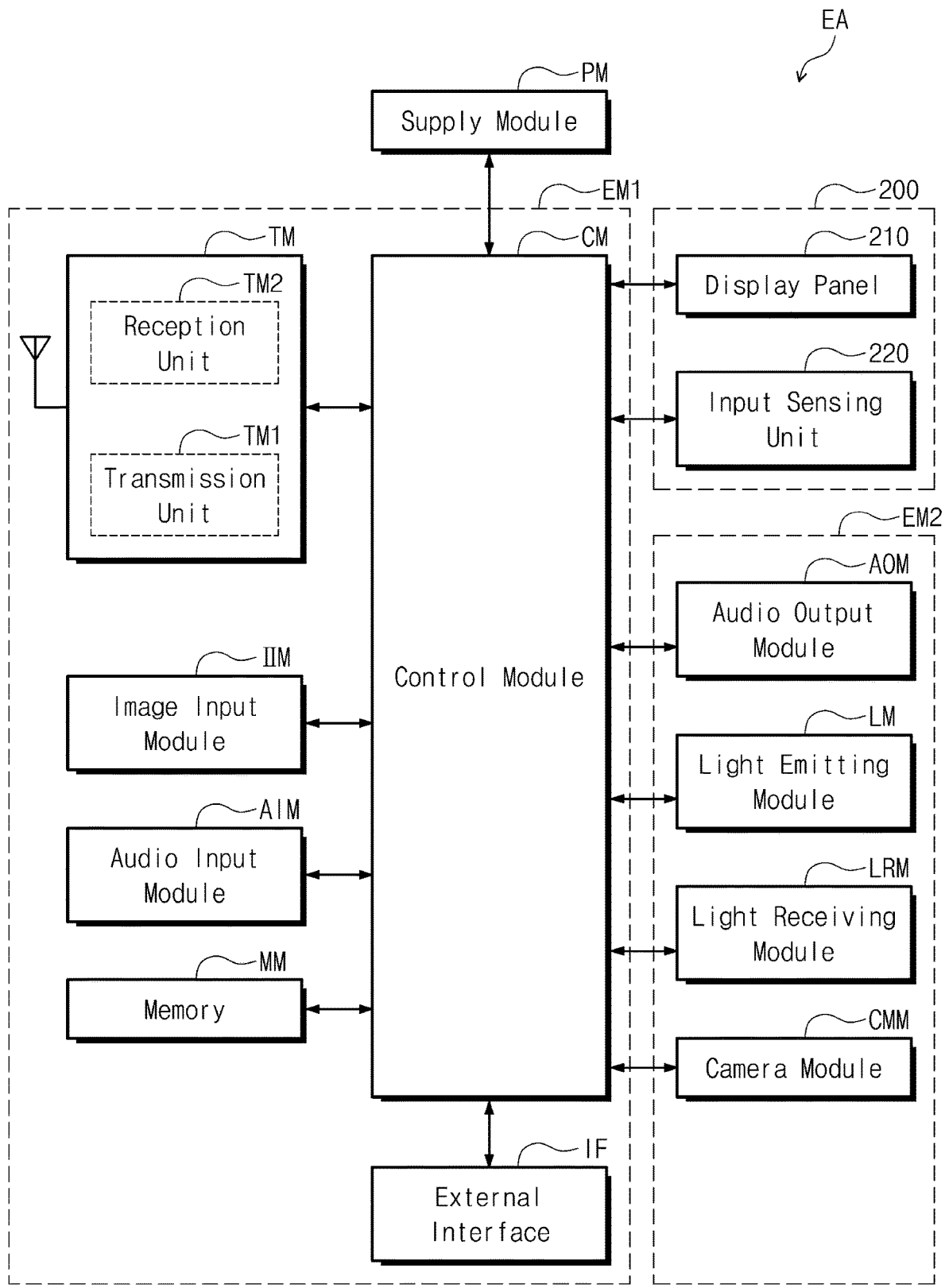
FIG. 2 is a block diagram illustrating a display device according to an embodiment of the present disclosure.

FIG. 1A is a perspective view of a display device according to an embodiment of the present disclosure. FIG. 1B is an exploded perspective view of a display device according to an embodiment of the present disclosure. FIG. 2 is a block diagram illustrating a display device according to an embodiment of the present disclosure. Hereinafter, the present disclosure will be described with reference to FIGS. 1A-2.

Referring to FIGS. 1A-2, a display device EA according to an embodiment of the present disclosure may be a device activated according to an electrical signal. The display device EA may include various embodiments. For example, the display device EA may include a tablet, a notebook, a computer, a television, and the like. In this embodiment, the display device EA is shown as a smart phone, for example.

The display device EA may display an image IM toward the third direction DR3 on the display surface FS parallel to the first direction DR1 and the second direction DR2. For example, the image IM is displayed on a plane expanded along the first direction DR1 and the second direction DR2. The display surface FS on which the image IM is displayed may correspond to the front surface of the display device EA and may correspond to the front surface FS of the window 100. Hereinafter, the same reference numeral FS will be used for the display surface and the front surface of the display device EA, and the front surface of the window 100. The image IM may include still images as well as dynamic images (e.g., moving images, e.g., video). In FIG. 1A, a watch window and application icons are shown as an example of the image IM.

In the present embodiment, the front surface (or upper surface) and the rear surface (or lower surface) of each member are defined with reference to the direction in which the image IM is displayed. For example, the front surface and the rear surface of each member of the display device are defined with respect to the third direction DR3. For example, the front surface and the rear surface are opposite to each other in the third direction DR3, and the normal direction of each of the front surface and the rear surface may be parallel to the third direction DR3. Moreover, the directions that the first to third directions DR1, DR2, and DR3 indicate may be converted to other directions as a relative concept.

Referring to FIG. 1B, the display device EA may include a window 100, a display module 200, a driving circuit unit 300, a housing 400, and electronic modules 500. In the present embodiment, the window 100 and the housing 400 may be combined to form an appearance of the display device EA. For example, the window 100 and the housing 400 are the components (or members) of the display device EA, which enclose other components of the display device EA, as illustrated in FIG. 1A.

The window 100 may include an optically transparent insulating material. For example, the window 100 may include glass or plastic. The window 100 may have a multi-layer structure or a single-layer structure. For example, the window 100 may include a plurality of plastic films bonded together with an adhesive, or may include a glass substrate and a plastic film bonded together with an adhesive.

The window 100 may be divided into a transmission area TA and a bezel area BZA on a plane (e.g., a plan view). In this specification, the meaning of "being on a plane" or "in a plan view" means that it is viewed in the third direction DR3. In addition, "the thickness direction" may mean the third direction DR3.

The transmission area TA may be an optically transparent area. The bezel area BZA may be an area with a lower light transmittance compared to the transmission area TA. The bezel area BZA may define the shape of the transmission area TA. The bezel area BZA is adjacent to the transmission area TA and may surround the transmission area TA.

The bezel area BZA may have a set or predetermined color. The bezel area BZA covers the peripheral area NAA of the display module 200 so as to prevent or reduce the peripheral area NAA from being visually recognized from the outside. For example, the bezel area BZA reduces the possibility of the peripheral area NAA being visible to the user. On the other hand, this is illustrated by way of example, and in the window 100 according to an embodiment of the present disclosure, the bezel area BZA may be omitted.

In an embodiment of the present disclosure, the sensor areas SA1 and SA2 may be areas overlapping the electronic modules 500 to be described later. The display device EA may receive an external signal for the electronic modules 500 through the sensor areas SA1 and SA2 or may provide a signal outputted from the electronic modules 500 to the outside. According to embodiments of the present disclosure, the sensor areas SA1 and SA2 may overlap the transmission area TA. Therefore, a separate area for the sensor areas SA1 and SA2 may be omitted. Thus, the area of the bezel area BZA may be relatively reduced.

In FIG. 1B, the two sensor areas SA1 and SA2 are illustrated, but the present disclosure is not limited thereto. For example, the sensor areas SA1 and SA2 may be defined in three or more, or one of them may be omitted and they may be defined in the singular. In addition, in FIG. 1B, the sensor areas SA1 and SA2 are defined at the left upper end of the transmission area TA by way of example, but the sensor areas SA1 and SA2 may be located in various areas such as the right upper end of the transmission area TA, the center of the transmission area TA, the left lower end of the transmission area TA, or the right lower end of the transmission area TA. In addition, one sensor area SA1 may be defined at the left upper end of the transmission area TA, and the other sensor area SA2 may be defined at the right upper end of the transmission area TA.

The display module 200 may be located under the window 100. In this specification, "below" may refer to a direction opposite to a direction in which the display module 200 displays an image. For example, in one embodiment, "below" may refer to a direction opposite to the third direction DR3. The display module 200 may display an image IM and detect an external input TC. The display module 200 includes a front surface IS including an active area AA and a peripheral area NAA. The active area AA may be an area activated according to an electrical signal. For example, the active area AA may turn on in response to receiving an electrical signal.

In the present embodiment, the active area AA is an area where the image IM is displayed, and at the same time, an area where the external input TC is detected. The transmission area TA may at least overlap the active area AA. For example, the transmission area TA overlaps the front surface or at least a portion of the active area AA. Accordingly, the user may view the image IM through the transmission area TA and/or provide an external input TC.

The peripheral area NAA may be an area covered by the bezel area BZA. The peripheral area NAA is adjacent to the active area AA. The peripheral area NAA may surround the active area AA. A driving circuit or driving wiring for driving the active area AA may be located in the peripheral area NAA.

In this embodiment, the display module 200 is assembled in a flat state in which the active area AA and the peripheral area NAA face the window 100. However, this is illustratively shown, and a portion of the peripheral area NAA may be bent. In some embodiments, a portion of the peripheral area NAA faces the rear surface of the display device EA, so that the area of the bezel area BZA on the front surface of the display device EA may be relatively reduced. Alternatively, the display module 200 may be assembled in a state in which a portion of the active area AA is also bent. Alternatively, in the display module 200 according to an embodiment of the present disclosure, the peripheral area NAA may be omitted.

The display module 200 may include a display panel 210 and an input sensing unit 220.

The display panel 210 may generate an image IM. The image IM generated by the display panel 210 is displayed on the front surface IS and is visually recognized by the user through the transmission area TA.

The input sensing unit 220 detects an external input TC applied from the outside. For example, the input sensing unit 220 may detect an external input TC provided to the window 100. The external input TC may be a user input. The user's inputs include various types of external inputs such as touch (e.g., by a part of the user's body), light, heat, pen, or pressure. In this embodiment, the external input TC is shown with the user's hand applied to (or touching) the front surface FS. But, this is illustrated by way of example, and as described above, the external input TC may be provided in various forms, and also, according to the structure of the display device EA, the external input TC applied to the side or rear surface of the display device EA may be detected, and the present disclosure is not limited to any one embodiment.

The driving circuit unit 300 may be electrically connected to the display module 200. The driving circuit unit 300 may include a main circuit board MB and a flexible film CF.

The flexible film CF is electrically connected to the display module 200. The flexible film CF may connect the display module 200 and the main circuit board MB. For example, the flexible film CF acts as an electrical interconnect between the display module 200 and the main circuit board MB. The flexible film CF may be connected to the pads (e.g., display pads) of the display module 200 located in the peripheral area NAA. The flexible film CF provides the display module 200 with an electrical signal for driving the display module 200. For example, the display module 200 receives the driving electrical signal via the flexible film CF. The electrical signal may be generated from the flexible film CF or generated from the main circuit board MB.

The flexible film CF may be electrically connected to the display panel 210 and the input sensing unit 220. Therefore, the flexible film CF provides the display module 200 with an electrical signal for driving the display panel 210 and an electrical signal for driving the input sensing unit 220. The electrical signal may be generated from the flexible film CF or generated from the main circuit board MB.

The main circuit board MB may include various driving circuits for driving the display module 200, connectors for power supply, and the like. The flexible film CF may be connected to the main circuit board MB. According to the present disclosure, one main circuit board MB and one flexible film are connected to the display module 200. However, this is illustrated by way of example, and in the display module 200 according to an embodiment of the present disclosure, the display panel 210 and the input sensing unit 220 may be connected to different main circuit boards and different flexible films.

In one embodiment of the present disclosure, one area of the display module 200 corresponding to the sensor areas SA1 and SA2 may have a relatively higher transmittance than the active area AA that does not overlap the sensor areas SA1 and SA2. For example, at least some of the components of the display panel 210 and the components of the input sensing unit 220 may be removed. Therefore, the electronic modules 500 located to overlap the sensor areas SA1 and SA2 may transmit and/or receive a signal through the sensor areas SA1 and SA2.

FIG. 1B illustrates that set or predetermined holes MH1 and MH2 (e.g., hereinafter referred to as module holes) are defined in one areas of the display module 200 corresponding to the sensor areas SA1 and SA2. The module holes MH1 and MH2 may be defined in the active area AA and penetrate the display module 200. The display panel 210 and the input sensing unit 220 may be penetrated by the module holes MH1 and MH2. That is, the module holes MH1 and MH2 may be defined by removing all of the configurations of the display panel 210 and the configurations of the input sensing unit 220, which overlap with the sensor areas SA1 and SA2. The module holes MH1 and MH2 are defined in the active area AA, so that the sensor areas SA1 and SA2 may be located in the transmission area TA.

The electronic modules 500 may include a first electronic module 501 and a second electronic module 502. On a plane (for example, in a plan view of a plane expanded along the first direction DR1 and the second direction DR2), the first and second electronic modules 501 and 502 may overlap with the module holes MH1 and MH2 and the sensor areas SA1 and SA2. The first and second electronic modules 501 and 502 may be located under the display module 200, and at least a portion of the first and second electronic modules 501 and 502 may be received in the module holes MH1 and MH2. The first and second electronic modules 501 and 502 may receive an external input transmitted through the sensor areas SA1 and SA2 or provide an output through the sensor areas SA1 and SA2.

The housing 400 is coupled with the window 100. The housing 400 is coupled with the window 100 to provide a set or predetermined space (e.g., inner space) to accommodate the display module 200 and the electronic modules 500 inside the display device EA. The display module 200 and the electronic modules 500 may be accommodated in an internal space.

The housing 400 may include a material having a relatively high stiffness or rigidity. For example, the housing 400 may include a plurality of frames and/or plates including glass, plastic, or metal, or a combination thereof. The housing 400 may provide protection to (e.g., may stably protect) the components of the display device EA accommodated in the inner space from external impacts.

As shown in FIG. 2, the display device EA may include a display module 200, a power supply module PM, a first electronic module EM1, and a second electronic module EM2. The display module 200, the power supply module PM, the first electronic module EM1, and the second electronic module EM2 may be electrically connected to each other.

The power supply module PM supplies power necessary for the overall operation of the display device EA. The power supply module PM may include a battery module.

The first electronic module EM1 and the second electronic module EM2 may include various functional modules for operating the display device EA.

The first electronic module EM1 may be on (e.g., directly mounted on) a motherboard electrically connected to the display module 200 or may be on (e.g., mounted on) a separate board and electrically connected to the motherboard through a connector or the like.

The first electronic module EM1 may include a control module CM, a wireless communication module TM, an image input module IIM, an audio input module AIM, a memory MM, and an external interface IF. In some embodiments, of the modules may not be mounted on the motherboard, but may be electrically connected to the motherboard through a flexible circuit board.

The control module CM controls the overall operation of the display device EA. The control module CM may be a microprocessor. For example, the control module CM activates or deactivates the display module 200. The control module CM may control other modules such as the image input module IIM or the audio input module AIM based on the touch signal received from the display module 200.

The wireless communication module TM may transmit/receive a wireless signal to/from another device (e.g., an external device) terminal using a Bluetooth or a Wi-Fi connection. The wireless communication module TM may transmit and/or receive a voice signal using a general communication line. The wireless communication module TM may include a transmission unit TM1 for modulating and transmitting a signal to be transmitted, and a reception unit TM2 for demodulating the received signal.

The image input module IIM processes the image signal and converts it into image data that may be displayed on the display module 200. The audio input module AIM receives an external audio signal by a microphone in a recording mode, a voice recognition mode, etc., and converts it into electrical voice data.

The external interface IF may serve as an interface connected to an external charger, a wired and/or wireless data port, and a card socket (e.g., a memory card, a subscriber identification module (SIM) or user identity module (UIM) card, and the like).

The second electronic module EM2 may include an audio output module AOM, a light emitting module LM, a light receiving module LRM, and a camera module CMM. The configurations may be on (e.g., directly mounted on) the motherboard, or on (e.g., mounted on) a separate substrate and electrically connected to the display module 200 through a connector, or electrically connected to the first electronic module EM1.

The audio output module AOM converts the audio data received from the wireless communication module TM or the audio data stored in the memory MM and outputs the converted audio data.

The light emitting module LM generates and outputs light. The light emitting module LM may output infrared rays. The light emitting module LM may include a light emitting diode (LED) element. The light receiving module LRM may sense infrared rays. The light receiving module LRM may be activated when an infrared ray of a set or predetermined level or higher is sensed. For example, the light receiving module LRM may turn on in response to an infrared ray of a set or predetermined level of light being applied to (or incident on) the light receiving module LRM. The light receiving module LRM may include a complementary metal-oxide-semiconductor (CMOS) sensor. After the infrared light generated by the light emitting module LM is outputted, the infrared light is reflected by an external object (e.g., a user finger or a face), and the reflected infrared light may be incident on the light receiving module LRM. The camera module CMM may capture an image of the outside.

Each of the first and second electronic modules 501 and 502 according to an embodiment of the present disclosure may include at least one of the first electronic module EM1 and the second electronic module EM2. For example, each of the first and second electronic modules 501 and 502 may include at least one of an audio output module AOM, a light emitting module LM, a light receiving module LRM, a camera module CMM, and a thermal sensing module. The first and second electronic modules 501 and 502 may sense an external input (e.g., signal) received through the sensor areas SA1 and SA2, and/or provide a sound signal such as a voice or light, such as infrared light, to the outside through the sensor areas SA1 and SA2.

Figure 3A:
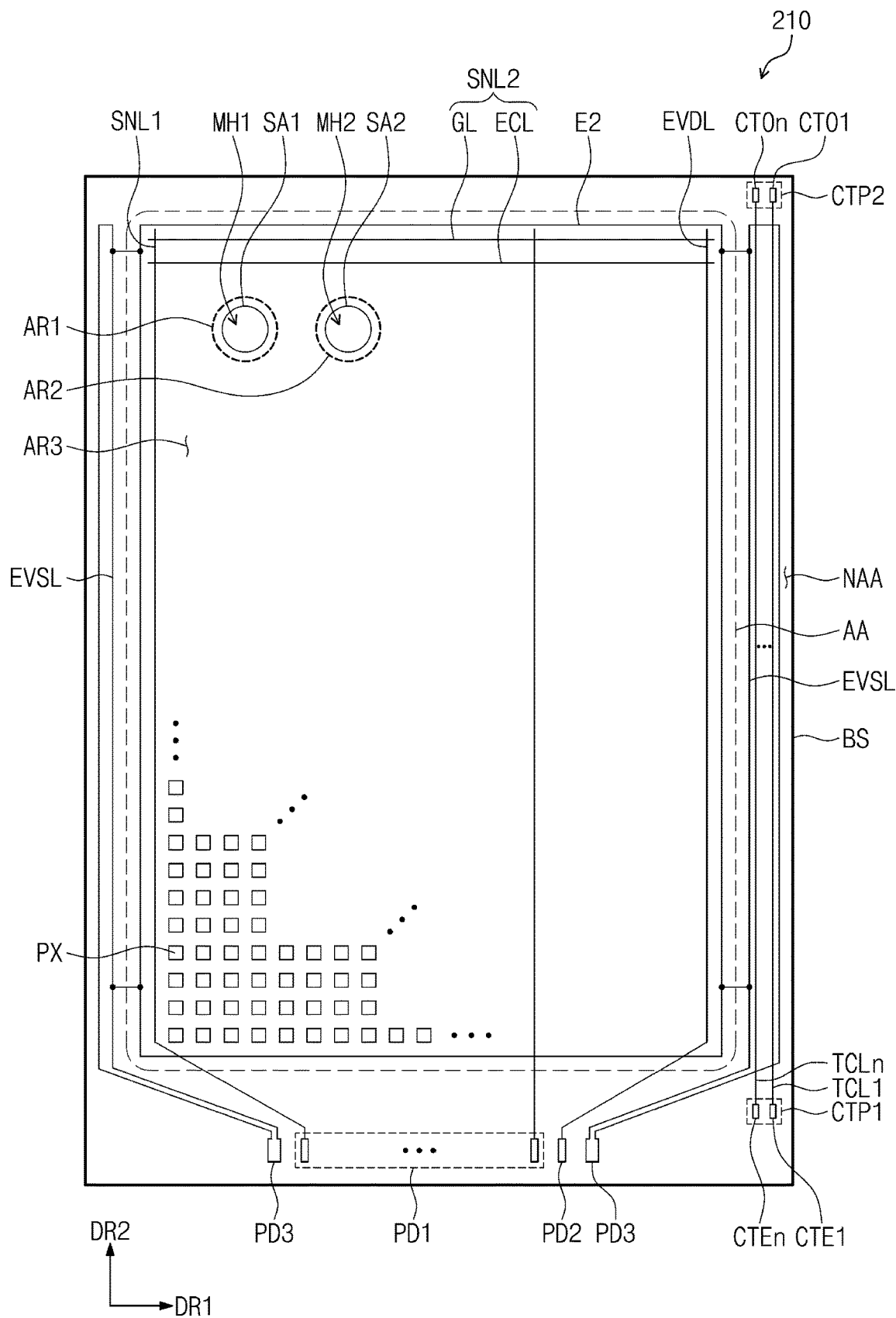
FIG. 3A is a plan view of a display panel according to an embodiment of the present disclosure.
Figure 3B:
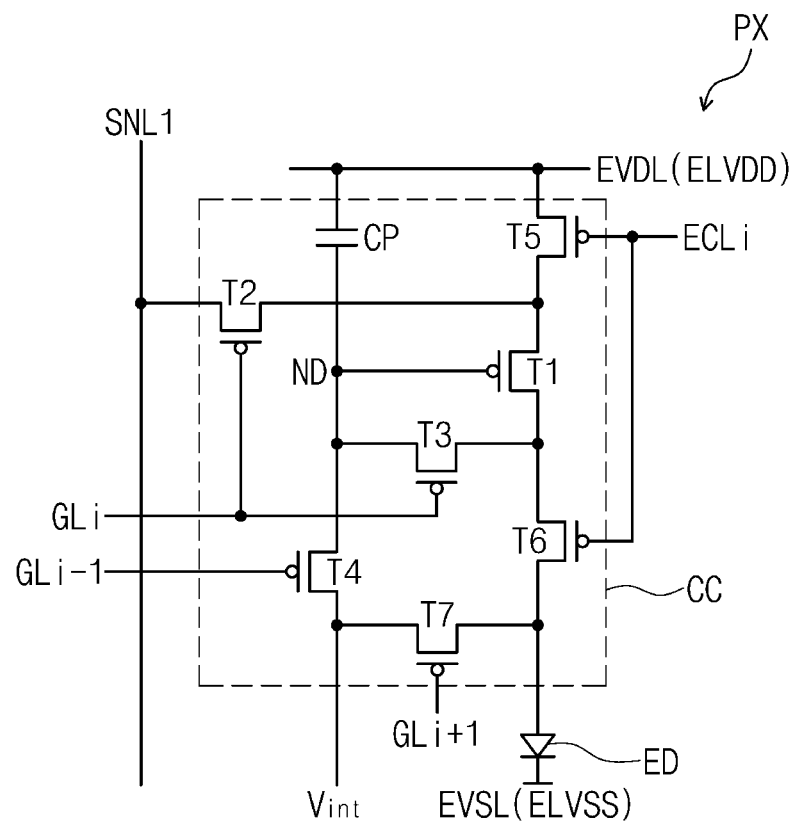
FIG. 3B is an equivalent circuit diagram of a pixel according to an embodiment of the present disclosure.
Figure 4:
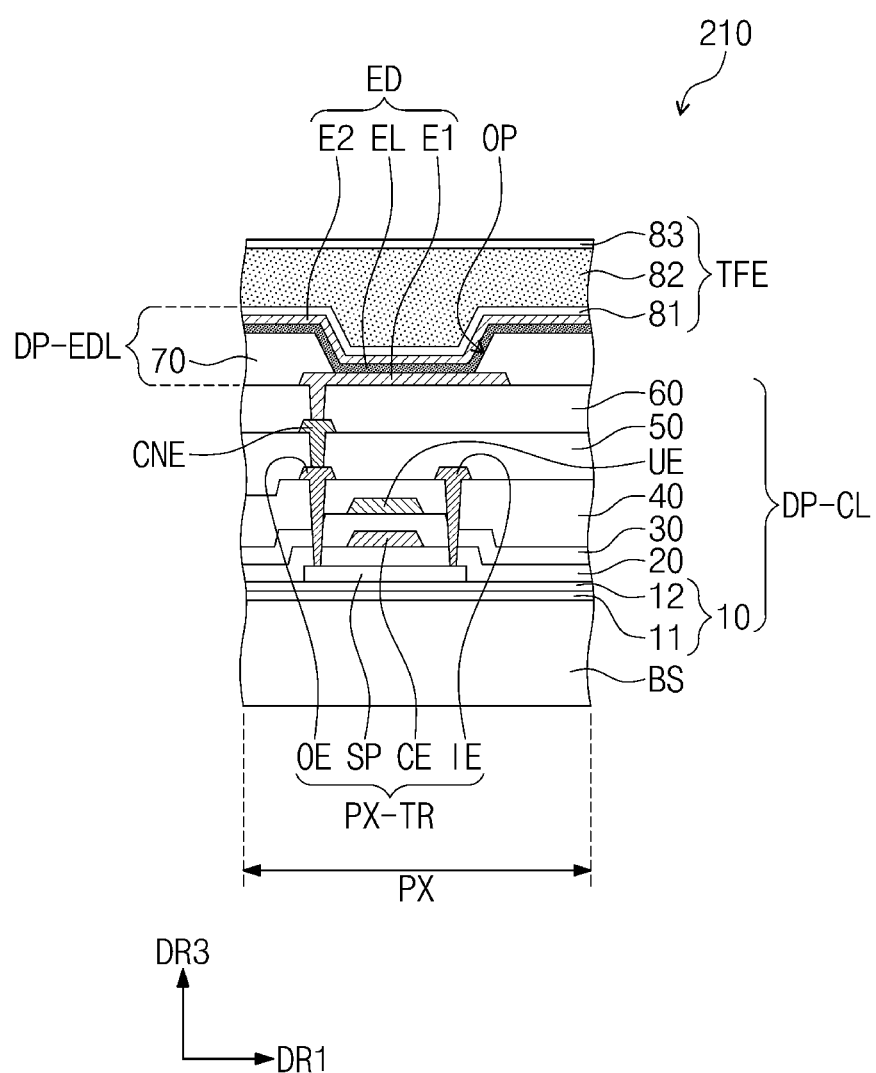
FIG. 4 is a cross-sectional view of a display panel shown in FIG. 3.

FIG. 3A is a plan view of a display panel according to an embodiment of the present disclosure, and FIG. 3B is an equivalent circuit diagram of one pixel according to an embodiment of the present disclosure. FIG. 4 is a cross-sectional view of a display panel shown in FIG. 3A.

Referring to FIG. 3A, the display panel 210 may include a base layer BS, a plurality of pixels PX, a plurality of signal wirings SNL1, SNL2, EVDL, and EVSL, and a plurality of display pads PD1 to PD3.

The active area AA of the display panel 210 is an area where an image is displayed and the peripheral area NAA may be an area where a driving circuit and corresponding wirings are located. In FIG. 3A, the active area AA and the peripheral area NAA of the display panel 210 are shown. A plurality of pixels PX may be located in the active area AA.

The base layer BS may be a silicon substrate, a plastic substrate, a glass substrate, an insulating film, or a laminated structure including a plurality of insulating layers.

The base layer BS may include a first area AR1, a second area AR2, and a third area AR3. The first area and the second area AR1 and AR2 may be defined to be spaced from each other. When viewed on a plane, the third area AR3 may surround the first and second areas AR1 and AR2. The third area AR3 may be surrounded by the peripheral area NAA. That is, the first to third areas AR1 to AR3 may be included in the active area AA. The pixels PX may be located in the third area AR3.

The first and second areas AR1 and AR2 may be areas overlapping the first and second sensor areas SA1 and SA2 on a plane, respectively. First and second module holes MH1 and MH2 may be in the first and second areas AR1 and AR2, respectively. Each of the first and second module holes MH1 and MH2 may include a hole penetrating the front and rear surfaces of the base layer BS.

The first area AR1 is formed with a larger size than the first module hole MH1, and the second area AR2 is formed with a larger size than the second module hole MH2. For example, the first module hole MH1 and the second module hole MH2 are relatively smaller in size than the first area AR1 and the second area AR2, respectively. Pixels PX for providing an image may not be located in the first and second areas AR1 and AR2. Therefore, the first and second areas AR1 and AR2 of the base layer BS may be defined as non-display areas in the display panel 210. The pixels PX may be located on the third area AR3 of the base layer BS. Therefore, an area including the third area AR3 of the base layer BS may be defined as a display area. That is, the display area of the display panel 210 corresponds to the third area AR3 of the base layer BS and the non-display area of the display panel 210 corresponds to the first and second areas AR1 and AR2 of the base layer BS. Although a structure in which the first and second areas AR1 and AR2 are formed with the same size is shown in FIG. 3A, in another embodiment of the present disclosure, the first and second areas AR1 and AR2 may have different sizes.

According to an embodiment of the present disclosure, a non-display area surrounded by the display area may be located on a plane. The non-display area may be an area overlapping the first and second electronic modules 501 and 502 (see FIG. 1B).

The plurality of signal wirings SNL1, SNL2, EVDL, and EVSL are connected to the pixels PX to transmit electrical signals to the pixels PX. Among the signal wirings included in the display panel 210, a first signal wiring SNL1, a second signal wiring SNL2, a first driving voltage wiring EVDL, and a second driving voltage wiring EVSL are shown, for example. The first signal wiring SNL1 may be referred to as data wiring. The first signal wiring SNL1 may be in plurality, and the first signal wirings SNL1 may be arranged along the first direction DR1. The second signal wiring SNL2 may include a scan wiring GL and a light emitting control wiring ECL. The scan wiring GL and the light emitting control wiring ECL may be arranged along the second direction DR2. However, this arrangement is shown as an example, and the signal wirings SNL1, SNL2, EVDL, and EVSL may further include an initialization voltage wiring, and are not limited to any one embodiment.

In FIG. 3B, an equivalent circuit diagram of one pixel PX from among the plurality of pixels PX is enlarged and illustrated. FIG. 3B illustrates a pixel PX connected to the i-th scan wiring GLi and an i-th light emitting control wiring ECLi.

The pixel PX may include a light emitting element ED and a pixel circuit CC. The pixel circuit CC may include a plurality of transistors T1 to T7 and a capacitor CP. The pixel circuit CC controls the amount of current flowing through the light emitting element ED in response to the data signal (e.g., SNL1).

Each of the plurality of transistors TI to T7 may include an input electrode (or a source electrode), an output electrode (or a drain electrode), and a control electrode (or a gate electrode). In the present disclosure, for convenience, either the input electrode or the output electrode may be referred to as a first electrode and the other may be referred to as a second electrode.

The first electrode of the first transistor T1 is connected to the first driving voltage wiring EVDL through the fifth transistor T5, and the second electrode of the first transistor T1 is connected to the anode electrode of the light emitting element ED through the sixth transistor T6. The first transistor T1 may be referred to as a driving transistor in the present disclosure. The first driving voltage wiring EVDL may receive the first driving voltage ELVDD.

The first transistor T1 controls the amount of current flowing through the light emitting element ED in response to the voltage applied to the control electrode of the first transistor T1.

The second transistor T2 is connected between the first signal wiring SNL1 and the first electrode of the first transistor T1. The control electrode of the second transistor T2 is connected to the i-th scan wiring GLi. The second transistor T2 is turned on when the i-th scan signal is applied to the i-th scan wiring GLi, thereby electrically connecting the first signal wiring SNL1 and the first electrode of the first transistor T1.

The third transistor T3 is connected between the second electrode of the first transistor T1 and the control electrode of the first transistor T1. The control electrode of the third transistor T3 is connected to the i-th scan wiring GLi. The third transistor T3 is turned on when the i-th scan signal is applied to the i-th scan wiring GLi, thereby electrically connecting the second electrode of the first transistor T1 and the control electrode of the first transistor T1. Therefore, when the third transistor T3 is turned on, the first transistor T1 is connected in a diode form (e.g., the first transistor T1 is diode connected).

The fourth transistor T4 is connected between a node ND and an initialization power generation unit (not shown). The control electrode of the fourth transistor T4 is connected to the (i−1)-th scan wiring GLi−1. The fourth transistor T4 is turned on when the (i−1)-th scan signal is applied to the (i−1)-th scan wiring GLi−1, thereby providing the initialization voltage Vint to the node ND.

The fifth transistor T5 is connected between the first driving voltage wiring EVDL and the first electrode of the first transistor T1. The control electrode of the fifth transistor T5 is connected to the i-th light emitting control wiring ECLi.

The sixth transistor T6 is connected between the second electrode of the first transistor T1 and the anode electrode of the light emitting element ED. The control electrode of the sixth transistor T6 is connected to an i-th light emitting control wiring ECLi.

The seventh transistor T7 is connected between the initialization power generation unit (not shown) and the anode electrode of the light emitting element ED. The control electrode of the seventh transistor T7 is connected to the (i+1)-th scan wiring GLi+1. The seventh transistor T7 is turned on when the (i+1)-th scan signal is applied to the (i+1)-th scan wiring GLi+1, thereby providing the initialization voltage Vint to the anode electrode of the light emitting element ED.

The seventh transistor T7 may improve the black display capability of the pixel PX. For example, when the seventh transistor T7 is turned on, the parasitic capacitor (not shown) of the light emitting element ED is discharged. Then, when the black luminance is realized, the light emitting element ED does not emit light due to the leakage current from the first transistor T1, and thus the black display capability may be improved.

In addition, although the control electrode of the seventh transistor T7 is illustrated as being connected to the (i+1)-th scan wiring GLi+1 in FIG. 3B, the embodiments of the present disclosure are not limited thereto. In another embodiment of the present disclosure, the control electrode of the seventh transistor T7 may be connected to the i-th scan wiring GLi or the (i−1)-th scan wiring GLi−1.

The cathode of the light emitting element ED is connected to the second driving voltage wiring EVSL. The second driving voltage wiring EVSL receives the second driving voltage ELVSS. Here, the second driving voltage ELVSS has a lower voltage level than the first driving voltage ELVDD.

In FIG. 3B, the p-channel metal oxide semiconductor (PMOS) transistors are shown as an example, however, the present disclosure is not limited thereto. In another embodiment of the present disclosure, the pixel circuit CC may be composed of one or more n-channel MOS (NMOS) transistors. In another embodiment of the present disclosure, the pixel circuit CC may include a combination of one or more NMOS and one or more PMOS transistors.

The capacitor CP is located between the first driving voltage wiring EVDL and the node ND. The capacitor CP stores a difference voltage between the first driving voltage EVDL and a voltage of the node ND. The voltage of the node ND is proportional to the data signal. When the fifth transistor T5 and the sixth transistor T6 are turned on according to the voltage stored in the capacitor CP, the amount of current flowing through the first transistor T1 may be determined. The equivalent circuit of the pixel PX in the present disclosure is not limited to the equivalent circuit shown in FIG. 3B. In another embodiment of the present disclosure, the pixel PX may be implemented in various forms to cause the light emitting element ED to emit light.

Referring to FIG. 4, the display panel 210 includes a base layer BS, a circuit element layer DP-CL, a light emitting element layer DP-EDL, and a thin film sealing layer TFE. In an embodiment, the base layer BS, the circuit element layer DP-CL, the light emitting element layer DP-EDL, and the thin film sealing layer TFE may be sequentially stacked in the third direction DR3.

The base layer BS may be a member that provides a base surface on which the circuit element layer DP-CL is located. The base layer BS may be a glass substrate, a metal substrate, a plastic substrate, or the like. However, the embodiment is not limited thereto, and the base layer BS may be an inorganic layer, an organic layer or a composite layer.

A circuit element layer DP-CL is located on the base layer BS. The circuit element layer DP-CL may include a pixel circuit CC (e.g., see FIG. 3B). That is, the circuit element layer DP-CL may include transistors T1 to T7 (e.g., see FIG. 3B) and a capacitor CP (e.g., see FIG. 3B). In FIG. 4, only one transistor PX-TR (hereinafter referred to as a pixel transistor) is illustrated for convenience of description. Here, the pixel transistor PX-TR may be the first transistor T1 described with reference to FIG. 3B.

The circuit element layer DP-CL further includes first to sixth insulating layers 10, 20, 30, 40, 50, and 60 stacked sequentially on the base layer BS in the third direction DR3. The first insulating layer 10 is located on the base layer BS. The first insulating layer 10 may include a barrier layer 11 and a buffer layer 12.

The barrier layer 11 may include an inorganic material. The barrier layer 11 may prevent or substantially prevent oxygen or moisture flowing through the base layer BS from penetrating the pixels PX (see FIG. 3A). For example, the barrier layer 11 may provide protection to the pixels PX from external oxygen or moisture flowing through the base layer BS. The buffer layer 12 may include an inorganic material. The buffer layer 12 may provide a lower surface energy to the pixels PX than the base layer BS so that the pixels PX are stably formed on the base layer BS. For example, the buffer layer 12 may provide structural stability to the pixels PX. In FIG. 4, the barrier layer 11 and the buffer layer 12 are each shown as a single layer. However, the barrier layer 11 and the buffer layer 12 according to an embodiment of the present disclosure may be provided in a plurality and may be stacked alternately with each other. In another embodiment, at least one of the barrier layer 11 and the buffer layer 12 may be provided in plurality or may be omitted.

The transistor PX-TR may be located on the first insulating layer 10. The transistor PX-TR includes a semiconductor pattern SP, a control electrode CE, an input electrode IE, and an output electrode OE. The semiconductor pattern SP is located on the first insulating layer 10. The semiconductor pattern SP may include a semiconductor material. The control electrode CE is spaced from the semiconductor pattern SP with the second insulating layer 20 therebetween. For example, the second insulating layer 20 provides a separation between the control electrode CE and the semiconductor pattern SP. The control electrode CE may be connected to one electrode of the capacitor CP.

The input electrode IE and the output electrode OE are spaced from the control electrode CE with the third insulating layer 30 and the fourth insulating layer 40 therebetween. For example, the third insulating layer 30 and the fourth insulating layer 40 provide a separation between the input electrode IE and the output electrode OE, and the control electrode CE. The input electrode IE and the output electrode OE penetrates the second insulating layer 20, the third insulating layer 30, and the fourth insulating layer 40 and are connected to one side and the other side of the semiconductor pattern SP, respectively.

An upper electrode UE may be located between the third insulating layer 30 and the fourth insulating layer 40. The upper electrode UE may be connected to the other electrode of the capacitor CP.

The fifth insulating layer 50 is located on the fourth insulating layer 40 to cover the input electrode IE and the output electrode OE. The fourth insulating layer 40 may include an organic material and/or an inorganic material, and may have a single layer or a laminated structure.

A connection electrode CNE may be located on the fifth insulating layer 50. The connection electrode CNE may be connected to the output electrode OE. The sixth insulating layer 60 may be located on the connection electrode CNE.

The pixel transistor PX-TR according to an embodiment of the present disclosure may be formed in various structures, and is not limited to the embodiment shown in FIG. 4.

The light emitting element layer DP-EDL is located on the circuit element layer DP-CL. The light emitting element layer DP-EDL may include a plurality of light emitting elements ED.

The light emitting element ED is located on the sixth insulating layer 60. The light emitting element ED may include a first electrode E1, a light emitting layer EL, and a second electrode E2. The first electrode E1 may penetrate the sixth insulating layer 60 to be electrically connected to the pixel transistor PX-TR through the connection electrode CNE.

A seventh insulating layer 70 may be located on the sixth insulating layer 60. An opening part OP may be defined in the seventh insulating layer 70, and the opening part OP may expose at least a portion of the first electrode E1. The seventh insulating layer 70 may be a pixel defining layer.

The light emitting layer EL may be located on the first electrode E1 exposed by the opening part OP defined in the seventh insulating layer 70. The light emitting layer EL may include a luminescent material. For example, the light emitting layer EL may be composed of at least one of materials emitting red, green, or blue light. The light emitting layer EL may include a fluorescent material or a phosphorescent material. The light emitting layer EL may include an organic light emitting material or an inorganic light emitting material. The light emitting layer EL may emit light in response to a potential difference between the first electrode E1 and the second electrode E2.

The second electrode E2 may be located on the light emitting layer EL. The second electrode E2 may be provided commonly to a plurality of pixels PX. In other words, the second electrode E2 may be a common electrode shared by the plurality of pixels. The second electrode E2 may have a shape corresponding to the active area AA (see FIG. 3A). The second electrode E2 may be electrically connected to the second driving voltage wiring EVSL (see FIG. 3A) located in the peripheral area NAA (see FIG. 3A). The second driving voltage wiring EVSL may provide the second driving voltage ELVSS (see FIG. 3B) to the second electrode E2. Therefore, each light emitting element ED located in each of the pixels PX may receive a common second driving voltage ELVSS through the second electrode E2.

The second electrode E2 may include a transmissive conductive material or a semi-transparent conductive material. Accordingly, light generated in (or emitted from) the light emitting layer EL may be emitted toward the third direction DR3 through the second electrode E2. But, this is illustrated by way of example. Depending on the design, the light emitting element ED according to an embodiment of the present disclosure may be driven in the rear surface light-emission system in which the first electrode E1 includes a transparent or semi-transparent material, or may be driven in a double-sided light-emission system in which light is emitted towards both front and rear surfaces (e.g., a dual emission display in which the light is emitted toward the third direction DR3 and a direction opposite to the third direction DR3), but is not limited to any one embodiment.

The thin film sealing layer TFE may be located on the light emitting element layer DP-EDL to seal the light emitting element ED. The thin film sealing layer TFE may cover the entire active area AA. The thin film sealing layer TFE may cover some areas of the peripheral area NAA.

The thin film sealing layer TFE may include a first inorganic layer 81, an organic layer 82, and a second inorganic layer 83 sequentially stacked along the third direction DR3. In this embodiment, each of the first inorganic layer 81, the organic layer 82, and the second inorganic layer 83 is shown as a single layer. However, this is illustratively shown, and at least one of the first inorganic layer 81, the organic layer 82, and the second inorganic layer 83 may be provided in plurality or may be omitted, but is not limited to any one embodiment.

The first inorganic layer 81 may cover the second electrode E2. The first inorganic layer 81 may prevent or reduce external moisture or oxygen from penetrating the light emitting element ED. For example, the first inorganic layer 81 may include silicon nitride, silicon oxide, or a combination thereof. The first inorganic layer 81 may be formed through a deposition process.

The organic layer 82 may be located on the first inorganic layer 81 and contact the first inorganic layer 81. The organic layer 82 may provide a flat surface on the first inorganic layer 81. For example, the organic layer 82 may provide a flat surface to the active area AA.

The curve formed on the upper surface of the first inorganic layer 81 and the particles existing on the first inorganic layer 81 are covered by the organic layer 82, such that this may prevent or reduce the influence of the surface state of the upper surface of the first inorganic layer 81 on the structures formed on the organic layer 82. Further, the organic layer 82 may relieve the stress between the contacting layers. The organic layer 82 may include an organic material, and may be formed through a solution process such as a spin coating process, a slit coating process, or an ink jet process.

The second inorganic layer 83 is located on the organic layer 82 to cover the organic layer 82. The second inorganic layer 83 may be stably formed on a relatively flat surface as compared to being located on the first inorganic layer 81. The second inorganic layer 83 seals moisture or the like emitted from the organic layer 82 to prevent or reduce it from being introduced into the outside. For example, the second inorganic layer 83 protects the organic layer 82 from external interferences by sealing the organic layer 82. The second inorganic layer 83 may include silicon nitride, silicon oxide, or a combination thereof. The second inorganic layer 83 may be formed through a deposition process.

Referring again to FIG. 3A, the display panel 210 includes a connection wiring part. The connection wiring part includes a plurality of sensing connection wirings TCL1 to TCLn. The plurality of sensing connection wirings TCL1 to TCLn are located in the peripheral area NAA. On a plane (e.g., a plane extended along the first direction DR1 and the second direction DR2), the plurality of sensing connection wirings TCL1 to TCLn may overlap the second driving power wiring EVSL. The plurality of sensing connection wirings TCL1 to TCLn may extend in the second direction DR2 and may be arranged along the first direction DR1.

The connection wiring part may further include first and second contact parts CTP1 and CTP2. The first contact part CTP1 is connected to one end of the plurality of sensing connection wirings TCL1 to TCLn and the second contact part CTP2 is connected to the other end of the plurality of sensing connection wirings TCL1 to TCLn. The first contact part CTP1 includes a plurality of first contact electrodes CTE1 to CTEn (e.g., CTE) located at (e.g., extends from) one end of the plurality of sensing connection wirings TCL1 to TCLn. The second contact part CTP2 includes a plurality of second contact electrodes CTO1 to CTOn located at the other end (e.g., opposite end) of the plurality of sensing connection wirings TCL1 to TCLn.

The connection wiring part may be electrically connected to the input sensing unit 220. For example, the plurality of sensing connection wirings TCL1 to TCLn may be in direct electrical contact with the sensing signal wiring part of the input sensing unit 220 through the first and second contact parts CTP1 and CTP2.

The display panel 210 may include a first pad PD1, a second pad PD2, and a third pad PD3 located in the peripheral area NAA. The first pad PD1 may be provided in a plurality and connected to the first signal wirings SNL1. The second pad PD2 may be electrically connected to the first driving voltage wiring EVDL, and the third pad PD3 may be electrically connected to the second driving voltage wiring EVSL. The display panel 210 may provide electrical signals from the outside (e.g., an external source) to the pixels PX through the first to third pads PD1 to PD3. In some embodiments, the display panel 210 may further include pads for receiving electrical signals other than the first to third pads PD1 to PD3, and are not limited to the embodiments shown in the current figures.

Figure 5:
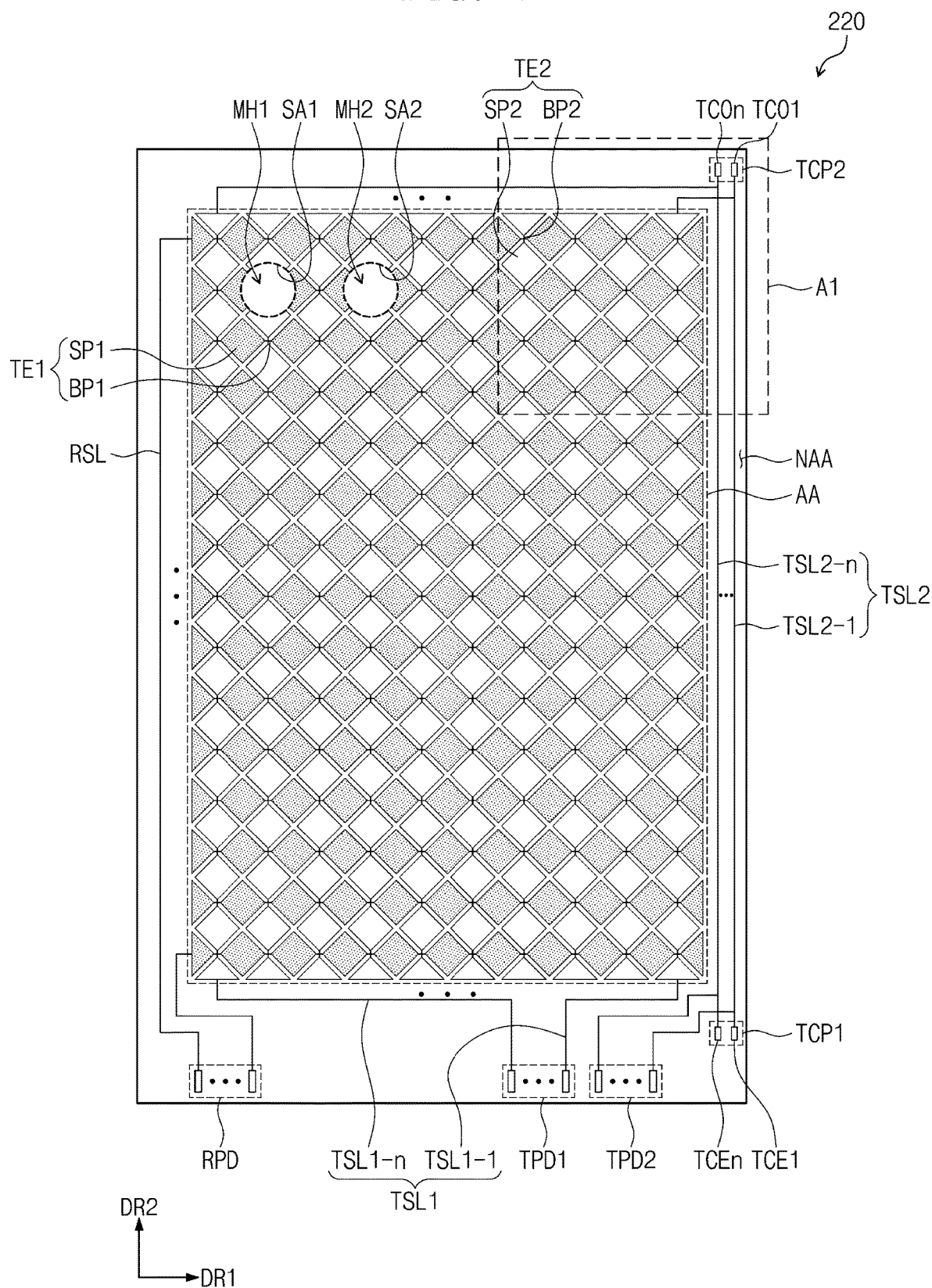
FIG. 5 is a plan view of an input sensing unit according to an embodiment of the present disclosure.
Figure 6:
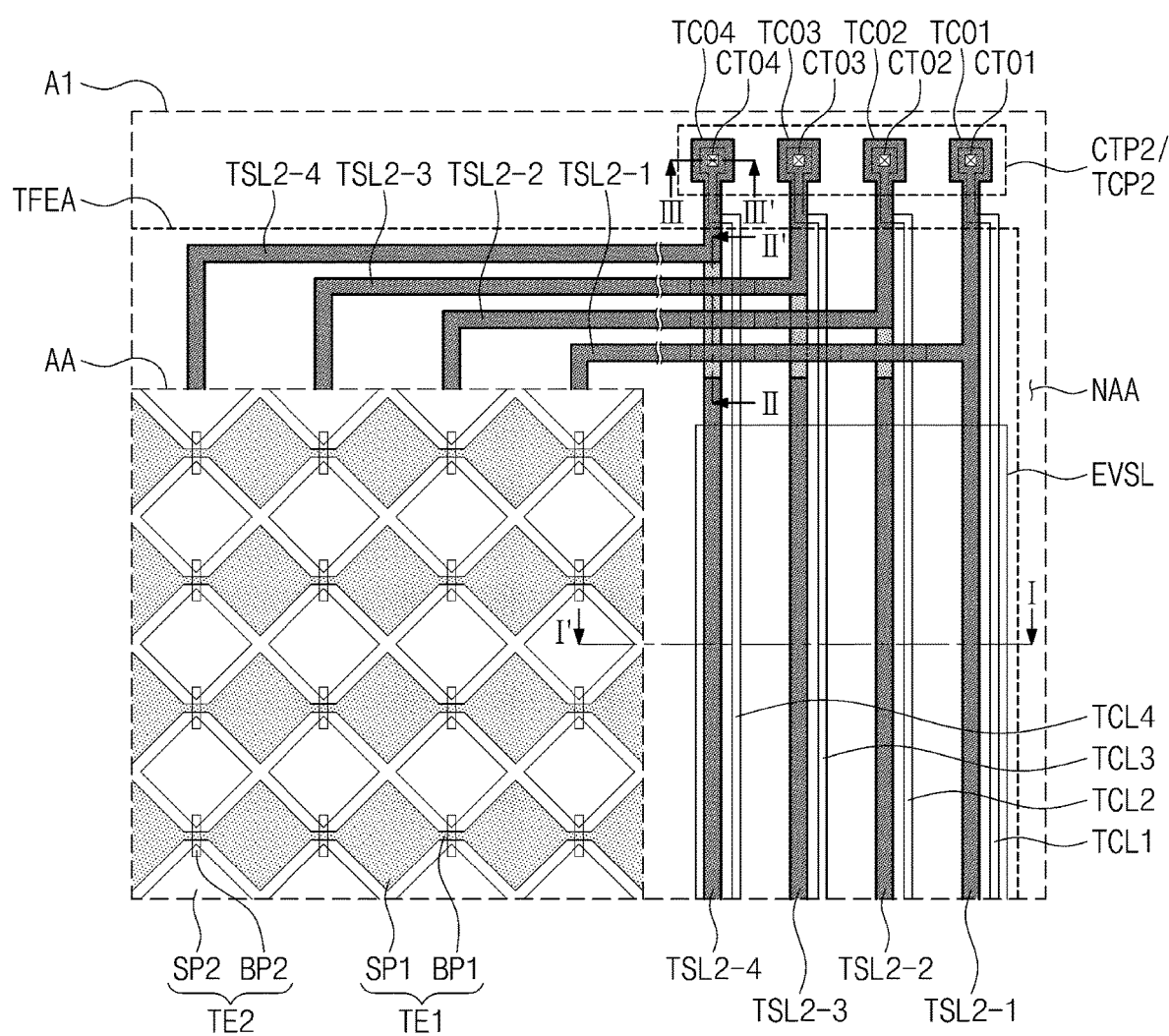
FIG. 6 is an enlarged plan view of an area A1 shown in FIG. 5.
Figure 7:
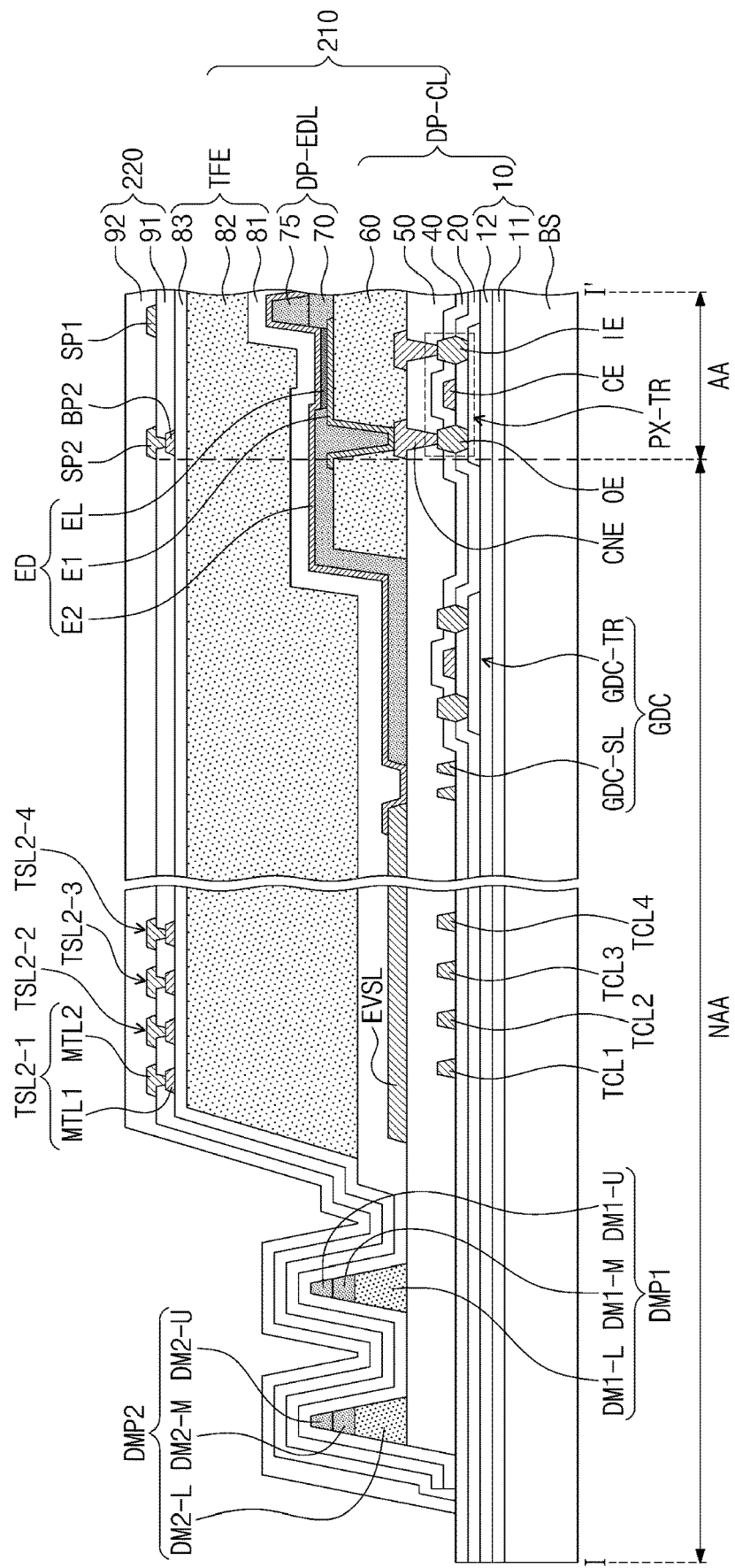
FIG. 7 is a cross-sectional view taken along the line I-I' shown in FIG. 6.
Figure 8:
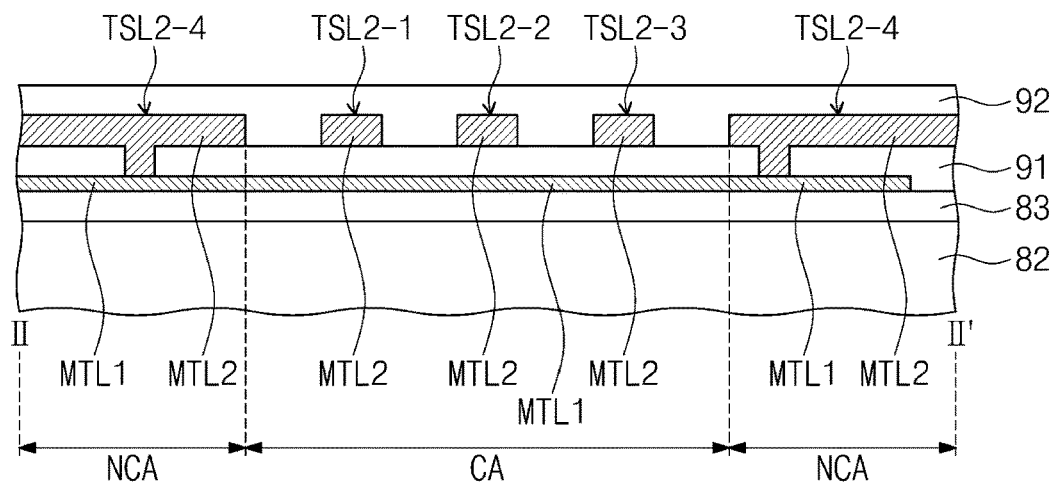
FIG. 8 is a cross-sectional view taken along the line II-II' shown in FIG. 6.
Figure 9:
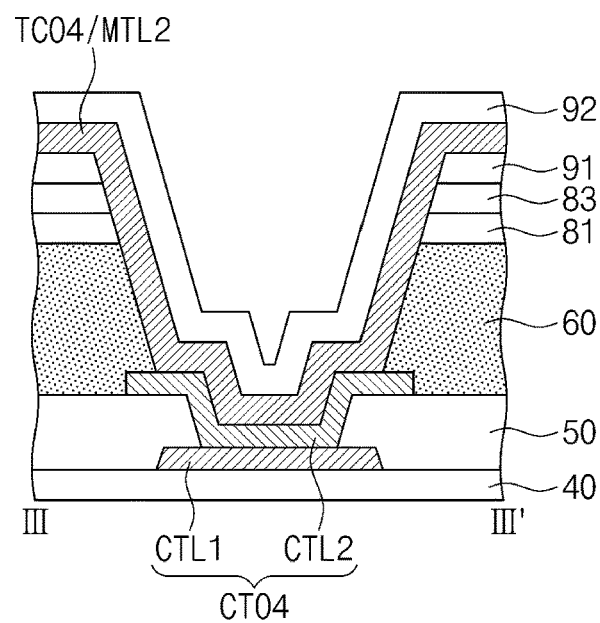
FIG. 9 is a cross-sectional view taken along the line III-III' shown in FIG. 6.

FIG. 5 is a plan view of an input sensing unit according to an embodiment of the present disclosure, and FIG. 6 is an enlarged plan view of an area A1 shown in FIG. 5. FIG. 7 is a cross-sectional view taken along the line of FIG. 6. FIG. 8 is a cross-sectional view taken along the line II-II' of FIG. 6. FIG. 9 is a cross-sectional view taken along the line III-III' of FIG. 6.

Referring to FIGS. 5 and 6, the input sensing unit 220 may be located on the display panel 210 (shown in FIG. 3A). The input sensing unit 220 is formed by a continuous process after forming the display panel 210. Thus, the input sensing unit 220 may be referred to as an input sensing layer.

The input sensing unit 220 includes a first sensing electrode TE1, a second sensing electrode TE2, sensing signal wiring parts RSL, TSL1, and TSL2, and sensing pad parts RPD, TPD1, and TPD2.

The first sensing electrode TE1 and the second sensing electrode TE2 are located in the active area AA. The input sensing unit 220 may obtain information on (e.g., regarding) the external input TC (see FIG. 1A) through a change in capacitance between the first sensing electrode TE1 and the second sensing electrode TE2.

The first sensing electrode TE1 may include a plurality of first sensing patterns SP1 and a plurality of first connection patterns BP1. At least one first connection pattern BP1 may be connected to two first sensing patterns SP1 adjacent to each other. For example, the first sensing patterns SP1 are arranged along the first and second directions DR1 and DR2, and the first connection patterns BP1 connect at least two first sensing patterns SP1 adjacent to each other in the first direction DR1.

The second sensing electrode TE2 may include a plurality of second sensing patterns SP2 and a plurality of second connection patterns BP2. At least one second connection pattern BP2 may be connected to two second sensing patterns SP2 adjacent to each other. For example, the second sensing patterns SP2 are arranged along the first and second directions DR1 and DR2, and the second connection patterns BP2 connect at least two second sensing patterns SP2 adjacent to each other in the second direction DR2.

The sensing signal wiring parts RSL, TSL1, and TSL2 are located in the peripheral area NAA. The sensing signal wiring parts RSL, TSL1, and TSL2 may include a reception wiring part RSL, a first transmission wiring part TSL1, and a second transmission wiring part TSL2.

The reception wiring part RSL is connected to the first sensing electrode TE1. The first and second transmission wiring parts TSL1 and TSL2 are connected to the second sensing electrode TE2. For example, the first transmission wiring part TSL1 is connected to one end of the second sensing electrode TE2, and the second transmission wiring part TSL2 is connected to the other end (e.g., opposite end) of the second sensing electrode TE2. The other end of the second sensing electrode TE2 may be a portion opposite to one end of the second sensing electrode TE2.

According to the embodiments of the present disclosure, the second sensing electrode TE2 has a relatively long length as compared to the first sensing electrode TE1 in the second direction DR2. That is, the first sensing electrode TE1 includes m first sensing pattern SP1 groups arranged along the second direction DR2, and n first sensing patterns SP1 are connected to each other and located in the first direction DR1 in each first sensing pattern SP1 group. In some embodiments, the second sensing electrode TE2 includes n second sensing pattern SP2 groups arranged along the first direction DR1, and m second sensing patterns SP2 are connected to each other and located in the second direction DR2 in each second sensing pattern SP2 group. In case that the input sensing unit 220 has a portrait shape in which sides along the second direction DR2 is greater than sides along the first direction DR1, n and m may be integers greater than 1, m may be a number greater than n. In this case, the length of each second sensing pattern SP2 group may be longer than the length of the first sensing pattern SP1 group. Therefore, by connecting both ends of the second sensing electrode TE2 to the first and second transmission wiring parts TSL1 and TSL2, the sensitivity according to the position of the second sensing electrode TE2 may be maintained uniformly.

According to some embodiments of the present disclosure, the first transmission wiring part TSL1 includes a plurality of one side (e.g., a first side) transmission wirings TSL1-1 to TSL1-n respectively connected to one side of the n second sensing pattern groups. The second transmission wiring part TSL2 includes a plurality of other side (e.g., a second side) transmission wirings TSL2-1 to TSL2-n connected to the other side of the n second sensing pattern groups.

The second transmission wiring part TSL2 further includes first and second sensing contact parts TCP1 and TCP2 extending from the plurality of other side (e.g., the second side) transmission wirings TSL2-1 to TSL2-n. As an example of the present disclosure, the first sensing contact part TCP1 is located adjacent to one end of the second sensing electrode TE2, and the second sensing contact part TCP2 is located adjacent to the other end of the second sensing electrode TE2. The first and second transmission wiring parts TSL1 and TSL2 are located in the peripheral area NAA, and for example, the first and second transmission wiring parts TSL1 and TSL2 may be formed in an area (hereinafter, referred to as a thin film sealing area TFEA) where a thin film sealing layer TFE (shown in FIG. 4) is located. The first and second sensing contact parts TCP1 and TCP2 may be located in the peripheral area NAA, and for example, may be located outside the thin film sealing area TFEA.

The first sensing contact part TCP1 includes a plurality of first sensing contact electrodes TCE1 to TCEn at one side of the plurality of other side transmission wirings TSL2-1 to TSL2-n. The second sensing contact part TCP2 includes a plurality of second sensing contact electrodes TCO1 to TCOn located at the other side (e.g., opposite side) of the plurality of other transmission wirings TSL2-1 to TSL2-n.

The first and second sensing contact parts TCP1 and TCP2 may be located at positions corresponding to the first and second contact parts CTP1 and CTP2 (e.g., see FIG. 3A) of the display panel 210. The first and second sensing contact parts TCP1 and TCP2 may directly contact the first and second contact parts CTP1 and CTP2, respectively. For example, the plurality of first sensing contact electrodes TCE1 to TCEn are in contact with the plurality of first contact electrodes CTE1 to CTEn, respectively, and the plurality of second sensing contact electrodes TCO1 to TCOn are in contact with the plurality of second contact electrodes CTO1 to CTOn, respectively.

The sensing pad parts RPD, TPD1, and TPD2 are located in the peripheral area NAA. In some embodiments, the sensing pad parts RPD, TPD1, and TPD2 may include a plurality of reception pads RPD, a plurality of first transmission pads TPD1, and a plurality of second transmission pads TPD2. The plurality of reception pads RPD are connected to the reception wiring part and electrically connected to the first sensing electrode TE1. The plurality of first transmission pads TPD1 are connected to the first transmission wiring part TSL1, and the plurality of second transmission pads TPD2 are connected to the second transmission wiring part TSL2. Therefore, the first transmission pad TPD1 and the second transmission pad TPD2 may be electrically connected to the second sensing electrode TE2.

In some embodiments, some of the components of the input sensing unit 220 may be removed or omitted from an area corresponding to the sensor areas SA1 and SA2. For example, at least some of the portion of the first sensing electrode TE1 and the portion of the second sensing electrode TE2 may not be located in the sensor areas SA1 and SA2. In one embodiment, the first sensing electrode TE1 may overlap the sensor areas SA1 and SA2 and may include the first sensing pattern SP1 having a portion removed, and the second sensing electrode TE2 may include the second sensing pattern SP2 having a portion removed. For example, the sensor areas SA1 and SA2 may have the first sensing pattern SP1 and the second sensing pattern SP2 at least partially removed.

According to the embodiments of the present disclosure, by removing a portion of the sensing electrodes TE1 and TE2 at the area overlapping the sensor areas SA1 and SA2, the problem that the electronic modules 500 (see FIG. 1B) are covered by (e.g., hidden behind) the first sensing electrode TE1 or the second sensing electrode TE2 may be prevented or substantially prevented. Therefore, the sensitivity (e.g., sensing sensitivity) of the electronic modules 500 may be improved.

Referring to FIGS. 6 and 7, a stacked structure of a circuit element layer DP-CL, a light emitting element layer DP-EDL, and a thin film sealing layer TFE located in the active area AA has the same configuration as that described with reference to FIG. 4 and thus, the detailed description thereof will be omitted.

The circuit element layer DP-CL may include a driving circuit GDC for driving the pixel circuit. The driving circuit GDC is located in the peripheral area NAA. The driving circuit GDC includes at least one transistor GDC-TR formed through the same process as the pixel transistors PX-TR in the active area AA. The driving circuit GDC may include control signal lines GDC-SL located on the same layer as the input electrode IE of the pixel transistor PX-TR. Although not separately illustrated, the driving circuit GDC may further include control signal lines located on the same layer as the control electrode CE of the pixel transistor PX-TR.

The second driving voltage wiring EVSL may be in the peripheral area NAA and located outside the driving circuit GDC. The second driving voltage wiring EVSL may be located on the same layer as the connection electrode CNE of the pixel transistor PX-TR. The second driving voltage wiring EVSL may receive the second driving voltage ELVSS from the outside.

The plurality of sensing connection wirings TCL1 to TCL4 are located in the peripheral area NAA. The plurality of sensing connection wirings TCL1 to TCL4 may be located on the same layer as the input electrode IE of the pixel transistor PX-TR. The plurality of sensing connection wirings TCL1 to TCL4 may be located below the second driving voltage wiring EVSL, and may be electrically separated from the second driving voltage wiring EVSL. For example, the plurality of sensing connection wirings TCL1 to TCL4 may be electrically isolated from the second driving voltage wiring EVSL. On a plane (e.g., for example, in a plan view of a plane expanded along the first direction DR1 and the second direction DR2), the plurality of sensing connection wirings TCL1 to TCL4 may overlap the second driving power wiring EVSL.

Referring to FIGS. 6 and 7, the input sensing unit 220 may include a first conductive layer, a second conductive layer, a first wiring layer, a second wiring layer, a first touch insulating layer 91, and a second touch insulating layer 92. The first conductive layer is located on the display panel 210. For example, the first conductive layer may be formed on a thin film sealing layer TFE. The first conductive layer may include at least one of the first and second sensing patterns SP1 and SP2 and the first and second connection patterns BP1 and BP2. As an example of the present disclosure, the first conductive layer may include the second connection pattern BP2. The first conductive layer is covered by the first touch insulating layer 91.

The second conductive layer is located on the first touch insulating layer 91. The second conductive layer may include at least one of the first and second sensing patterns SP1 and SP2 and the first and second connection patterns BP1 and BP2. The second conductive layer may include the first connection pattern BP1 and the first and second sensing patterns SP1 and SP2. A contact hole for connecting the second connection pattern BP2 and the second sensing pattern SP2 may be in the first touch insulating layer 91.

The second conductive layer is covered by the second touch insulating layer 92. The first and second touch insulating layers 91 and 92 may have an insulating property, and may be optically transparent. The first and second touch insulating layers 91 and 92 may include at least one inorganic layer and/or an organic layer. For example, when the first and second touch insulating layers 91 and 92 include an organic layer, the ductility of the input sensing unit 220 may be improved. When the first and second touch insulating layers 91 and 92 include an inorganic layer, a thin input sensing unit 220 may be provided, and internal impact strength may be improved. The first and second touch insulating layers 91 and 92 according to an embodiment of the present disclosure may include various materials and are not limited to any one embodiment.

Each of the wirings of the sensing signal wiring parts RSL, TSL1, and TSL2 (see FIG. 5) may have a double wiring structure. As shown in FIG. 7, each of the plurality of other side transmission wirings TSL2-1 to TSL2-4 of the second transmission wiring part TSL2 may include a first wiring layer MTL1 and a second wiring layer MTL2. In FIG. 7, as an example of the present disclosure, only the second transmission wiring part TSL2 is illustrated, but the wirings of the wiring parts RSL and TSL1 may also include the first wiring layer MTL1 and the second wiring layer MTL2.

The first wiring layer MTL1 is located on the same layer as the first conductive layer. That is, the first conductive layer and the first wiring layer MTL1 are formed on the thin film sealing layer TFE through the same process, and the second conductive layer and the second wiring layer MTL2 are formed on the first touch insulating layer 91 through the same process.

The first wiring layer MTL1 may contact the corresponding second wiring layer MTL2 through a second contact hole in the first touch insulating layer 91. A plurality of second contact holes may be in the first touch insulating layer 91, and the plurality of second contact holes may be arranged at set or predetermined intervals along an extension direction of the corresponding wiring.

On a plane, the other side transmission wirings TSL2-1 to TSL2-4 of the second transmission wiring part TSL2 may overlap the plurality of sensing connection wirings TCL1 to TCL4 and the second driving power wiring EVSL. Each of the other side transmission wirings TSL2-1 to TSL2-4 may be electrically connected to a corresponding sensing connection wiring among the plurality of sensing connection wirings TCL1 to TCL4. Especially, by the first and second contact parts CTP1 and CTP2 contacted with the first and second sensing contact parts TCP1 and TCP2, the second transmission wiring part TSL2 may be electrically connected to (e.g., contacts) the connection wiring part.

As shown in FIG. 6, the plurality of second contact electrodes CTO1 to CTO4 located on the second contact part CTP2 are in direct contact with the plurality of second sensing contact electrodes TCO1 to TCO4 located on the second sensing contact part TCP2, respectively.

Referring to FIG. 8, a fourth other side transmission wiring TSL2-4 among the other side transmission wirings TSL2-1 to TSL2-4 may include the first wiring layer MTL1 and the second wiring layer MTL2. An area where the fourth other transmission wiring TSL2-4 crosses the other side transmission lines TSL2-1 to TSL2-3 may be defined as a crossing area CA, and an area that does not cross the other transmission lines TSL2-1 to TSL2-3 may be defined as a non-crossing area NCA.

In the non-crossing area NCA, the fourth other side transmission wiring TSL2-4 has a double layer structure in which the first and second wiring layers MTL1 and MTL2 are arranged side by side (e.g., or on top of each other in a stack structure, for example, the second wiring layer MTL2 may be stacked on the first wiring layers MTL1). In the crossing area CA, the fourth other side transmission wiring TSL2-4 may have a single layer structure including only one wiring layer (e.g., MTL1) of the first and second wiring layers MTL1 and MTL2. For example, in the crossing area CA, the fourth other side transmission wiring TSL2-4 may include only the first wiring layer MTL1. In the crossing area CA, the second wiring layer MTL2 of the fourth other side transmission wiring TSL2-4 may be removed or omitted.

First to third other side transmission wirings TSL2-1 to TSL2-3 among the other side transmission wirings TSL2-1 to TSL2-4 may have a single layer structure including only one wiring layer among the first and second wiring layers MTL1 and MTL2. Because the fourth other side transmission wiring TSL2-4 is composed of the first wiring layer MTL1 in the intersection (e.g., crossing) area, the first to third other side transmission wirings TSL2-1 to TSL2-3 may be composed of the second wiring layer MTL2 to avoid electrical contact with the fourth other side transmission wiring TSL2-4.

In the intersection (e.g., crossing) area CA, the arrangement structure between the other side transmission wirings TSL2-1 to TSL2-4 is not limited to FIGS. 6 and 8. That is, the arrangement structure of the other side transmission wirings TSL2-1 to TSL2-4 may be variously modified within a range in which they are not in electrical contact.

In FIG. 6, for convenience, it is shown that the other side transmission wirings TSL2-1 to TSL2-4 do not overlap with the corresponding sensing connection wirings TCL1 to TCL4 in the thin film sealing area TFEA, but they may substantially overlap on a plane.

Referring to FIGS. 6 and 9, each of the plurality of second sensing contact electrodes TCO1 to TCO4 are located at one end of the other side transmission wirings TSL2-1 to TSL2-4, respectively. The plurality of second sensing contact electrodes TCO1 to TCO4 overlap the plurality of second contact electrodes CTO1 to CTO4, respectively. The plurality of second sensing contact electrodes TCO1 to TCO4 contact the plurality of second contact electrodes CTO1 to CTO4, respectively, through contact holes.

As shown in FIG. 9, the second contact electrode CTO4 directly contact the second sensing contact electrode TCO4. The second contact electrode CTO4 may include first and second electrode layers CTL1 and CTL2. The first electrode layer CTL1 is located on the same layer as the sensing connection wirings TCL1 to TCL4 and located at one end of the corresponding sensing connection wiring TCL1 to TCL4. The second electrode layer CTL2 is located on the same layer as the second driving voltage wiring EVSL and is at an upper part of the first electrode layer CTL1.

The second electrode layer CTL2 may be exposed through contact holes in the sixth insulating layer 60, the first and second inorganic layers 81 and 83, and the first touch insulating layer 91. Therefore, the second sensing contact electrode TCO4 in the second contact part CTP2 may directly contact the second electrode layer CTL2 through the contact hole. The second sensing contact electrode TCO4 may be located on the same layer as the second wiring layer MTL2. Thus, by the second contact electrode CTO2 and the second sensing contact electrode TCO4, the fourth other side transmission wiring TSL2-4 may be electrically connected to the corresponding sensing connection wiring TCL4.

Referring to FIG. 7 again, the display panel 210 may further include first and second dam parts DMP1 and DMP2 located in a peripheral area NAA. As shown in FIG. 7, the first and second dam parts DMP1 and DMP2 may have a multilayer structure. The second dam part DMP2 may be located farther outside than the first dam part DMP1. The first dam part DMP1 includes a first lower dam DM1-L, a first intermediate dam DM1-M, and a first upper dam DM1-U. The second dam part DMP2 includes a second lower dam DM2-L, a second intermediate dam DM2-M, and a second upper dam DM2-U.

The first and second lower dams DM1-L and DM2-L may be formed simultaneously with the sixth insulating layer 60. The first and second intermediate dams DM1-M and DM2-M are on the first and second lower dams DM1-L and DM2-L, respectively. The first and second intermediate dams DM1-M and DM2-M may be formed simultaneously with the seventh insulating layer 70. The first and second upper dams DM1-U and DM2-U are located on the first and second intermediate dams DM1-M and DM2-M, respectively. The dummy insulating layer 75 formed simultaneously with the first and second upper dams DM1-U and DM2-U may be located on the seventh insulating layer 70 in the active area.

The first and second dam parts DMP1 and DMP2 may be provided with a closed loop shape in the peripheral area NAA to surround the active area AA. Accordingly, the first and second dam parts DMP1 and DMP2 may prevent or substantially prevent the liquid organic material in the active area AA from spreading outward in the process of forming the organic layer 82 of the thin film sealing layer TFE. For example, during the formation of the organic layer 82, the first and second dam parts DMP1 and DMP2 may prevent the liquid organic material from spilling. The organic layer 82 is formed by coating a liquid organic material on the first inorganic layer 81 through an inkjet method, and the first and second dam parts DMP1 and DMP2 may set a boundary of an area where a liquid organic material is located. The second dam part DMP2 may be located farther outside from the active area AA than the first dam part DMP1.

The structure of the first and second dam parts DMP1 and DMP2 are not limited to the embodiment of FIG. 7. For example, the display panel 210 may include only one dam part of the first and second dam parts DMP1 and DMP2. Also, although it is shown that each of the first and second dam parts DMP1 and DMP2 has a triple film structure, each of the first and second dam parts DMP1 and DMP2 may have a double film structure.

The first inorganic layer 81 and the second inorganic layer 83 may contact each other at the upper part (e.g., upper surface) of the first and second dam parts DMP1 and DMP2. Because the organic layer 82 is located inside the area defined by the first and second dam parts DMP1 and DMP2, the first inorganic layer 81 and the second inorganic layer 83 may contact each other on the first and second dam parts DMP1 and DMP2 to seal the organic layer 82.

The first and second contact parts CTP1 and CTP2 are located outside the first and second dam parts DMP1 and DMP2 so that it is possible to form a contact structure for contacting the other side transmission wirings TSL2-1 to TSL2-$n$ of the second transmission wiring part TSL2 and the plurality of sensing connection wirings TCL1 to TCLn.

In some embodiments, by connecting the second transmission wiring part TSL2 to the plurality of sensing connection wirings TCL1 to TCL4 in the display panel 210, the wiring resistance generated in the second transmission wiring part TSL2 may be reduced. The second transmission wiring part TSL2 has a length longer than that of the first transmission wiring part TSL1, thereby increasing the wiring resistance. When the line width of the second transmission wiring part TSL2 is increased to overcome the wiring resistance difference, the width of the peripheral area NAA may increase, thereby increasing the bezel width of the display device EA.

However, when the second transmission wiring part TSL2 is electrically connected to the plurality of sensing connection wirings TCL1 to TCL4 in the display panel 210, the wiring resistance may be reduced without increasing the line width of the second transmission wiring part TSL2. In addition, because the plurality of sensing connection wirings TCL1 to TCL4 are arranged in a structure overlapping with the second driving voltage wiring EVSL and the second transmission wiring part TSL2 on a plane, the bezel width is not increased by the plurality of sensing connection wirings TCL1 to TCL4. Therefore, the wiring resistance of the second transmission wiring part TSL2 may be reduced without increasing the bezel width.

Figure 10:
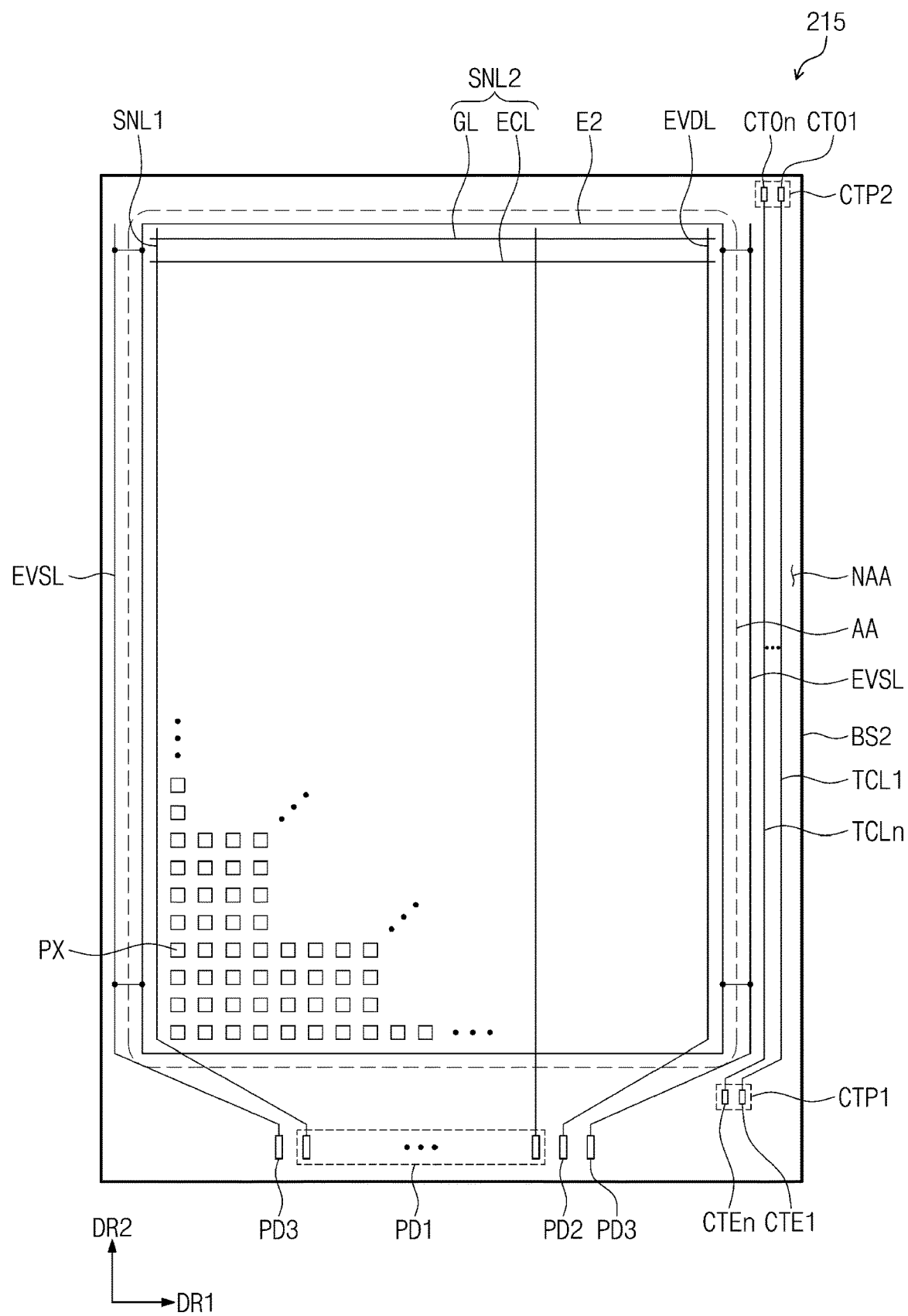
FIG. 10 is a plan view of a display device according to an embodiment of the present disclosure.
Figure 11:
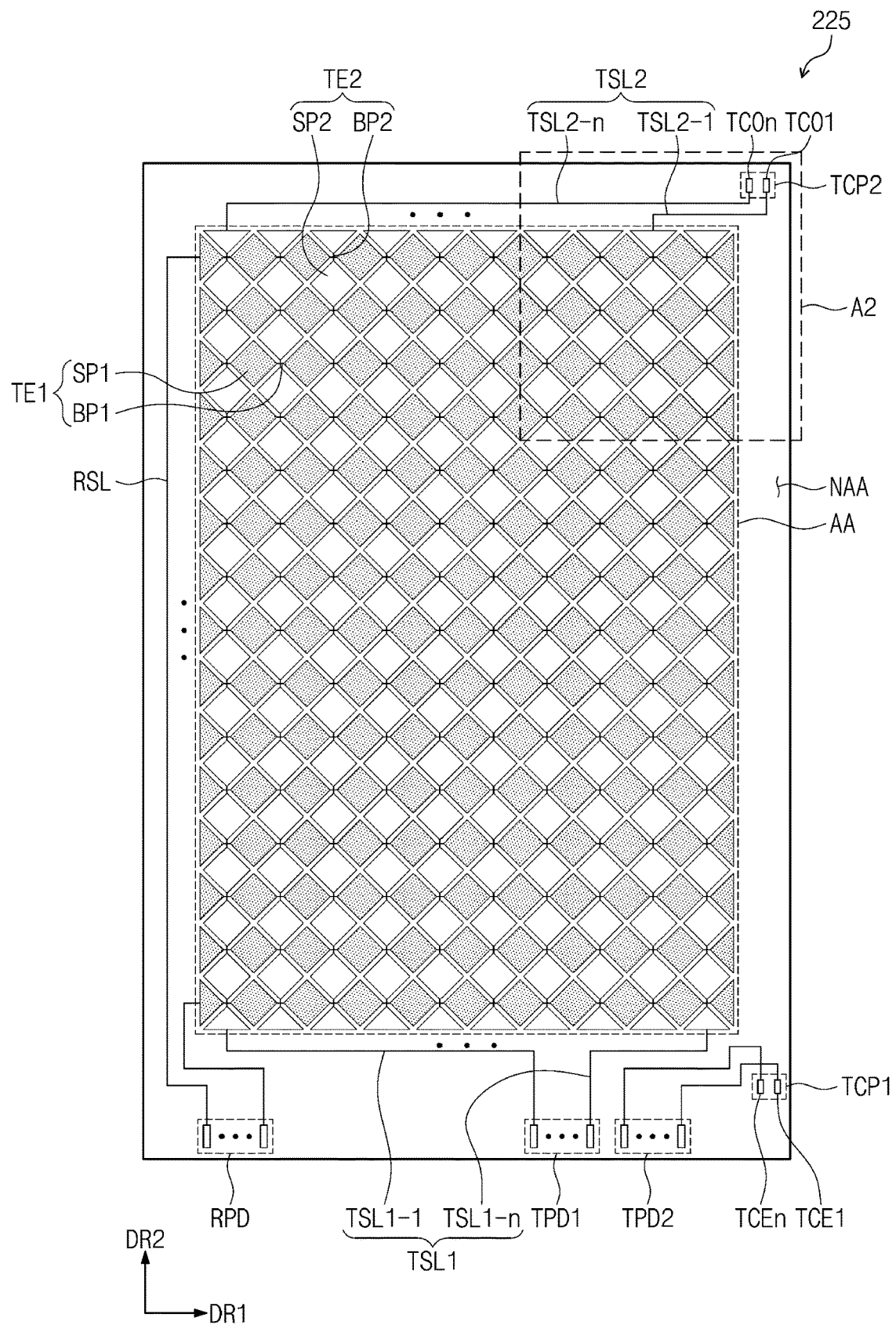
FIG. 11 is a plan view of an input sensing unit according to an embodiment of the present disclosure.
Figure 12:
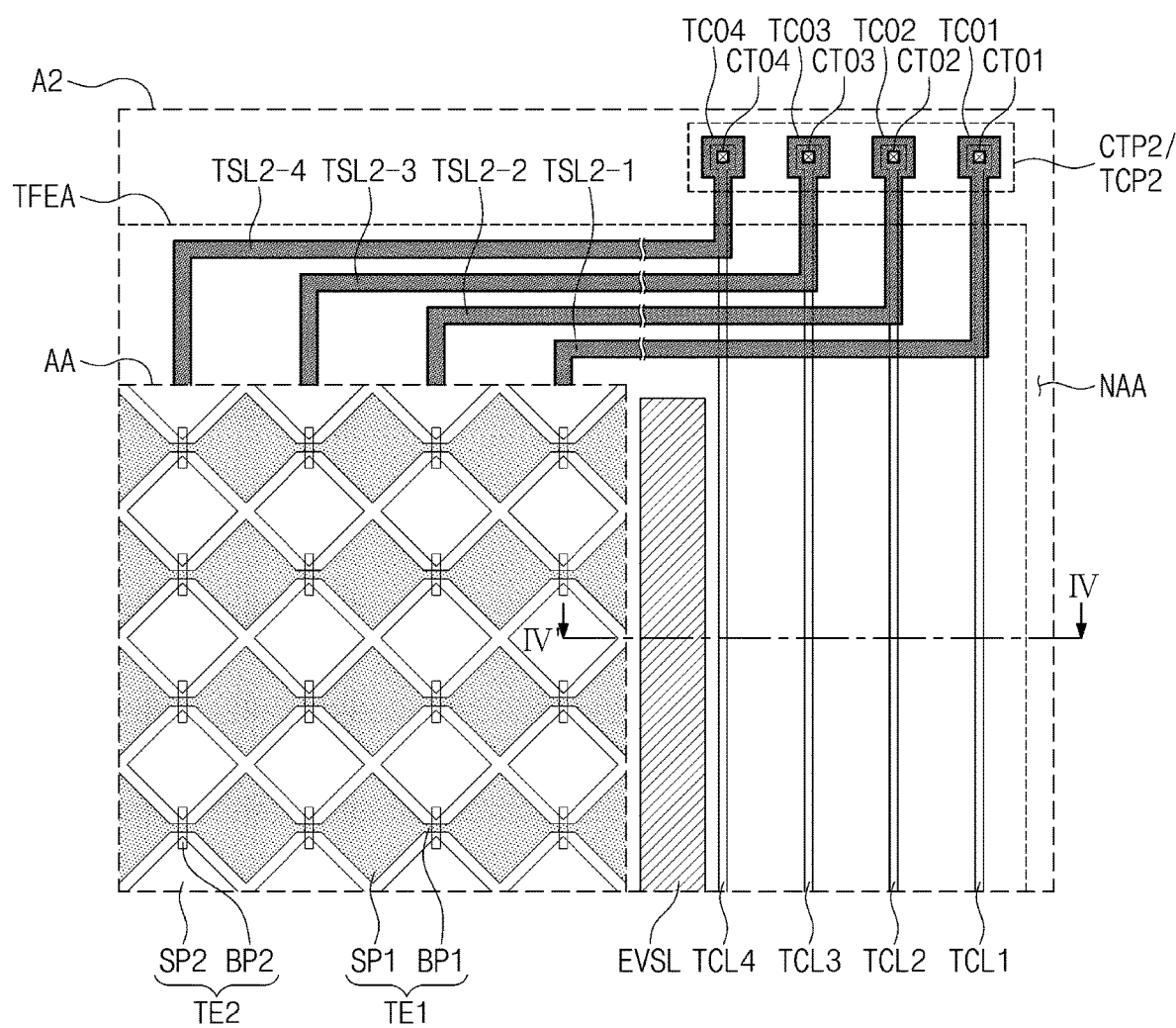
FIG. 12 is an enlarged plan view of an area A2 shown in FIG. 11.
Figure 13:
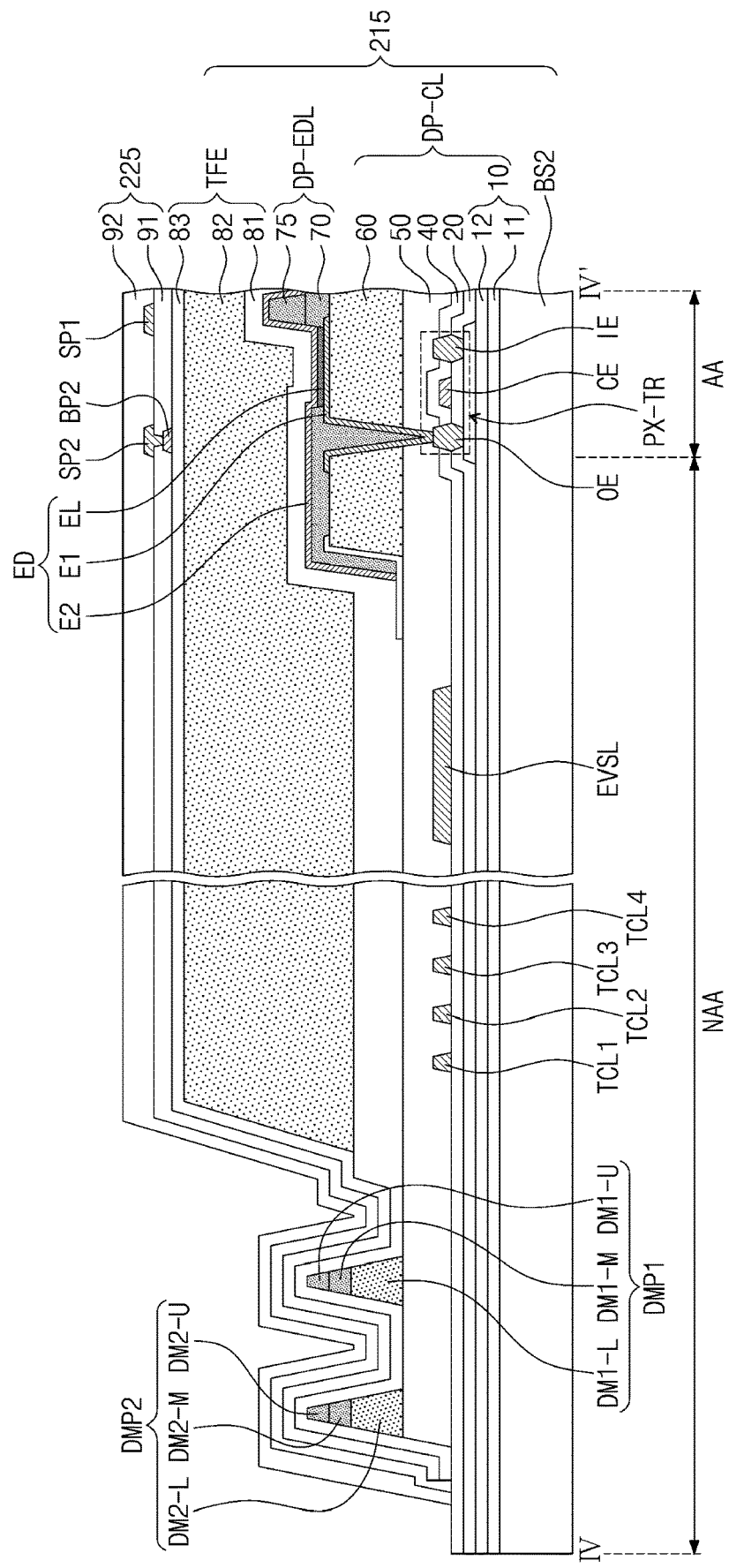
FIG. 13 is a cross-sectional view taken along the line IV-IV shown in FIG. 12.

FIG. 10 is a plan view of a display panel according to an embodiment of the present disclosure, and FIG. 11 is a plan view of an input sensing unit according to an embodiment of the present disclosure. FIG. 12 is an enlarged plan view of an area A2 shown in FIG. 11, and FIG. 13 is a cross-sectional view taken along the line IV-IV' shown in FIG. 12.

Referring to FIG. 10, in the display panel 215 according to an embodiment of the present disclosure, unlike the base layer BS shown in FIG. 3A, the base layer BS2 is not divided into the first to third areas AR1 to AR3. That is, the first and second module holes MH1 and MH2 (shown in FIG. 3A) may not be in the base layer BS2.

The display panel 215 may include a connection wiring part in a peripheral area NAA. The connection wiring part includes a plurality of sensing connection wirings TCL1 to TCLn. The plurality of sensing connection wirings TCL1 to TCLn may extend in the second direction DR2 and may be arranged along the first direction DR1. The plurality of sensing connection wirings TCL1 to TCLn may be located further outside than the second driving voltage wiring EVSL.

The connection wiring part includes a first contact part CTP1 connected to one end of the plurality of sensing connection wirings TCL1 to TCLn and a second contact part CTP2 connected to the other end of the plurality of sensing connection wirings TCL1 to TCLn. The first contact part CTP1 includes a plurality of first contact electrodes CTE1 to CTEn located at one end of the plurality of sensing connection wirings TCL1 to TCLn. The second contact part CTP2 includes a plurality of second contact electrodes CTO1 to CTOn located at the other end of the plurality of sensing connection wirings TCL1 to TCLn.

The connection wiring part may be electrically connected to the input sensing unit 225. In particular, the plurality of sensing connection wirings TCL1 to TCLn may electrically be in direct contact with the sensing signal wiring part of the input sensing unit 225 through the first and second contact parts CTP1 and CTP2.

Referring to FIG. 11, in an embodiment of the present disclosure, the first transmission wiring part TSL1 includes a plurality of one side transmission wirings TSL1-1 to TSL1-*n* respectively connected to one side of the n second sensing pattern groups. The second transmission wiring part TSL2 includes a plurality of other side transmission wirings TSL2-1 to TSL2-*n* connected to the other side of the n second sensing pattern groups. The second transmission wiring part TSL2 further includes first and second sensing contact parts TCP1 and TCP2. The first sensing contact part TCP1 includes a plurality of first sensing contact electrodes TCE1 to TCEn extending from the plurality of second transmission pads TPD2. The second sensing contact part TCP2 includes a plurality of second sensing contact electrodes TCO1 to TCOn located at the other side of the plurality of other transmission wirings TSL2-1 to TSL2-*n*.

As an example of the present disclosure, the first sensing contact part TCP1 is located adjacent to one end of the second sensing electrode TE2, and the second sensing contact part TCP2 is located adjacent to the other end of the second sensing electrode TE2. The first and second transmission wiring parts TSL1 and TSL2 are located in the peripheral area NAA, and in particular, the first and second transmission wiring parts TSL1 and TSL2 may be located in an area TFEA where a thin film sealing layer TFE (shown in FIG. 4) is formed. The first and second sensing contact parts TCP1 and TCP2 may be located in the peripheral area NAA, and for example, may be located outside the thin film sealing area TFEA.

The first and second sensing contact parts TCP1 and TCP2 may be located at positions corresponding to the first and second contact parts CTP1 and CTP2 (see FIG. 10) of the display panel 215. The first and second sensing contact parts TCP1 and TCP2 may directly contact the first and second contact parts CTP1 and CTP2, respectively. For example, the plurality of first sensing contact electrodes TCE1 to TCEn are in contact with the plurality of first contact electrodes CTE1 to CTEn, respectively, and the plurality of second sensing contact electrodes TCO1 to TCOn are in contact with the plurality of second contact electrodes CTO1 to CTOn, respectively.

As shown in FIG. 12, on a plane, the plurality of sensing connection wirings TCL1 to TCL4 may be located outside the first driving power wiring EVSL. Each of the other side transmission wirings TSL2-1 to TSL2-4 may be electrically connected to a corresponding sensing connection wiring among the plurality of sensing connection wirings TCL1 to TCL4. Especially, by the first and second contact parts CTP1 and CTP2 contacted with the first and second sensing contact parts TCP1 and TCP2, the second transmission wiring part TSL2 may be electrically connected to the connection wiring part.

The plurality of second contact electrodes CTO1 to CTO4 formed on the second contact part CTP2 are in direct contact with the plurality of second sensing contact electrodes TCO1 to TCO4 formed on the second sensing contact part TCP2, respectively.

Referring to FIG. 13, some wirings (e.g., the transmission wirings TSL2-1 to TSL2-4 shown in FIG. 7) overlapping elements and wirings of the display panel 215 are removed or omitted on the thin film sealing layer TFE in the peripheral area NAA. Therefore, coupling interference between the sensing signal wiring part of the input sensing unit and the elements (or wirings) of the display panel may be reduced, and as a result, the sensitivity degradation of the input sensing unit 225 due to the electrical signal interference may be prevented or reduced.

The display device according to an embodiment of the present disclosure electrically connects the sensing signal wiring part in the input sensing unit to the connection wiring part in the display panel so that the wiring resistance of the sensing signal wiring part may be reduced. In addition, because the connection wiring part is located in a structure overlapping with the sensing signal wiring part on a plane, an increase in the bezel width due to the connection wiring part may be prevented or reduced.

In addition, as some wirings of the sensing signal wiring part are located on the display panel, it is possible to prevent or reduce the sensitivity degradation due to electrical signal interference between the display panel and the input sensing unit.

Although the embodiments of the present disclosure have been described, it is understood that the present disclosure should not be limited to these embodiments but various changes and modifications may be made by one ordinary skilled in the art within the spirit and scope of the present disclosure as hereinafter claimed.

What is claimed is:

1. A display device comprising:
    a base layer having an active area and a peripheral area located outside the active area;
    a circuit element layer comprising a pixel circuit located in the active area of the base layer and a driving voltage wiring located in the peripheral area of the base layer to supply a driving voltage to the pixel circuit;
    a light emitting element layer comprising a plurality of light emitting elements on the circuit element layer;
    a thin film sealing layer covering the light emitting element layer; and
    an input sensing layer on the thin film sealing layer, the input sensing layer comprising a sensing electrode and a sensing signal wiring part connected to the sensing electrode,
    wherein the circuit element layer comprises a connection wiring part overlapping the driving voltage wiring in the peripheral area and being in contact with the sensing signal wiring part,
    wherein the connection wiring part is located at a different layer from the driving voltage wiring.

2. The display device of claim 1, wherein the sensing electrode comprises:
    a first sensing electrode; and
    a second sensing electrode electrically insulated from the first sensing electrode to form a capacitance.

3. The display device of claim 2, wherein the sensing signal wiring part comprises:
    a reception wiring part connected to the first sensing electrode; and
    a transmission wiring part connected to the second sensing electrode,
    wherein the connection wiring part contacts the reception wiring part or the transmission wiring part.

4. The display device of claim 3, wherein the transmission wiring part comprises:
    a first transmission wiring part connected to one end of the second sensing electrode; and
    a second transmission wiring part connected to the other end of the second sensing electrode,
    wherein the connection wiring part contacts the second transmission wiring part.

5. The display device of claim 4, wherein the second transmission wiring part comprises:
    a plurality of other side transmission wirings connected to the other end of the second sensing electrode;
    a first sensing contact part located at one end of the plurality of other side transmission wirings; and
    a second sensing contact part located at the other end of the plurality of other side transmission wirings.

6. The display device of claim 5, wherein the connection wiring part comprises:
    a plurality of sensing connection wirings extending along the plurality of other side transmission wirings;
    a first contact part connected to one end of the plurality of sensing connection wirings to face the first sensing contact part; and
    a second contact part connected to the other end of the plurality of sensing connection wirings to face the second sensing contact part.

7. The display device of claim 6, wherein the plurality of sensing connection wirings is overlapping the driving voltage wiring.

8. The display device of claim 6, wherein the first sensing contact part directly contacts the first contact part, and the second sensing contact part directly contacts the second contact part.

9. The display device of claim 6, wherein each of the plurality of other side transmission wirings comprises:
    a first wiring layer on the thin film sealing layer; and
    a second wiring layer located adjacent to the first wiring layer with a touch insulating layer of the input sensing layer interposed therebetween,
    wherein the first wiring layer and the second wiring layer are electrically connected to each other.

10. The display device of claim 9, wherein each of the plurality of other side transmission wirings comprises one of the first wiring layer and the second wiring layer in a crossing area where the plurality of other side transmission wirings cross.

11. The display device of claim 1, wherein the pixel circuit comprises:
    a pixel transistor comprising a control electrode, an output electrode, and an input electrode; and
    a connection electrode on the output electrode,
    wherein the light emitting element is electrically connected to the connection electrode.

12. The display device of claim 11, wherein the driving voltage wiring is located at the same layer as the connection electrode,
    wherein the connection wiring part is located at the same layer as the input electrode and the output electrode.

13. The display device of claim 1, wherein the active area comprises a non-display area having at least one hole, and having a display area surrounding the non-display area,
    wherein the pixel circuit and the light emitting element are located in the display area.

* * * * *